US012646814B2

(12) United States Patent
Zhang et al.

(10) Patent No.: US 12,646,814 B2
(45) Date of Patent: Jun. 2, 2026

(54) LOW EMISSION THREE-DIMENSIONAL MULTIPLEXER COMPRISING AN INDUCTOR STRUCTURE HAVING MULTIPLE QUADRUPOLE OR DIPOLE INDUCTORS

(71) Applicant: QUALCOMM Incorporated, San Diego, CA (US)

(72) Inventors: Lisette Zhang, Vista, CA (US); Chinmaya Mishra, San Diego, CA (US); Med Nariman, Ladera Ranch, CA (US)

(73) Assignee: QUALCOMM Incorporated, San Diego, CA (US)

( * ) Notice: Subject to any disclaimer, the term of this patent is extended or adjusted under 35 U.S.C. 154(b) by 378 days.

(21) Appl. No.: 18/339,509

(22) Filed: Jun. 22, 2023

(65) Prior Publication Data

US 2024/0429587 A1      Dec. 26, 2024

(51) Int. Cl.
 H01P 1/213        (2006.01)
 H03H 7/12         (2006.01)
 H04B 1/00         (2006.01)
(52) U.S. Cl.
 CPC ............... H01P 1/213 (2013.01); H03H 7/12 (2013.01); H04B 1/0071 (2013.01)
(58) Field of Classification Search
 CPC .................................. H01P 1/213; H03H 7/12
 USPC ......................................................... 333/185
 See application file for complete search history.

(56) References Cited

U.S. PATENT DOCUMENTS

| | | | |
|---|---|---|---|
| 6,998,939 | B2 * | 2/2006 | Nakayama et al. ........................ H01F 17/0013 336/200 |
| 7,221,251 | B2 | 5/2007 | Menegoli et al. |
| 9,692,392 | B2 * | 6/2017 | Cabanillas et al. ....... H03F 1/56 |
| 9,954,267 | B2 | 4/2018 | Yun et al. |
| 10,468,179 | B2 | 11/2019 | Mika |
| 2004/0046621 | A1 * | 3/2004 | Furuya et al. ....... H03H 7/0115 333/132 |
| 2021/0226601 | A1 * | 7/2021 | Wang et al. ........... H03H 7/463 |
| 2021/0257156 | A1 | 8/2021 | Chang et al. |

FOREIGN PATENT DOCUMENTS

WO        2017116616 A1      7/2017

OTHER PUBLICATIONS

International Search Report and Written Opinion—PCT/US2024/030496—ISA/EPO—Nov. 6, 2024.
Partial International Search Report—PCT/US2024/030496—ISA/EPO—Sep. 12, 2024.
Poon A., et al., "Reduction of Inductive Crosstalk Using Quadrupole Inductors", IEEE Journal of Solid-state Circuits, IEEE, USA, vol. 44, No. 6, Jun. 1, 2009, pp. 1756-1764, XP011258518, p. 1757.

* cited by examiner

*Primary Examiner* — Benny T Lee
(74) *Attorney, Agent, or Firm* — Loza & Loza LLP

(57)       ABSTRACT

An inductor structure includes a first quadrupole inductor, and a second quadrupole inductor, wherein the second quadrupole inductor overlaps the first quadrupole inductor. In certain aspects, the inductor structure may be included in a filter, which may also include one or more capacitors coupled to the inductor structure.

30 Claims, 26 Drawing Sheets

Electronic Device 102

Processor 180

Memory 182

Instructions 184

Data 186

I/O Ports 190

Signal Processor 192

Modem 194

Transceiver 196

Wireless Link 106

Base Station 104

100

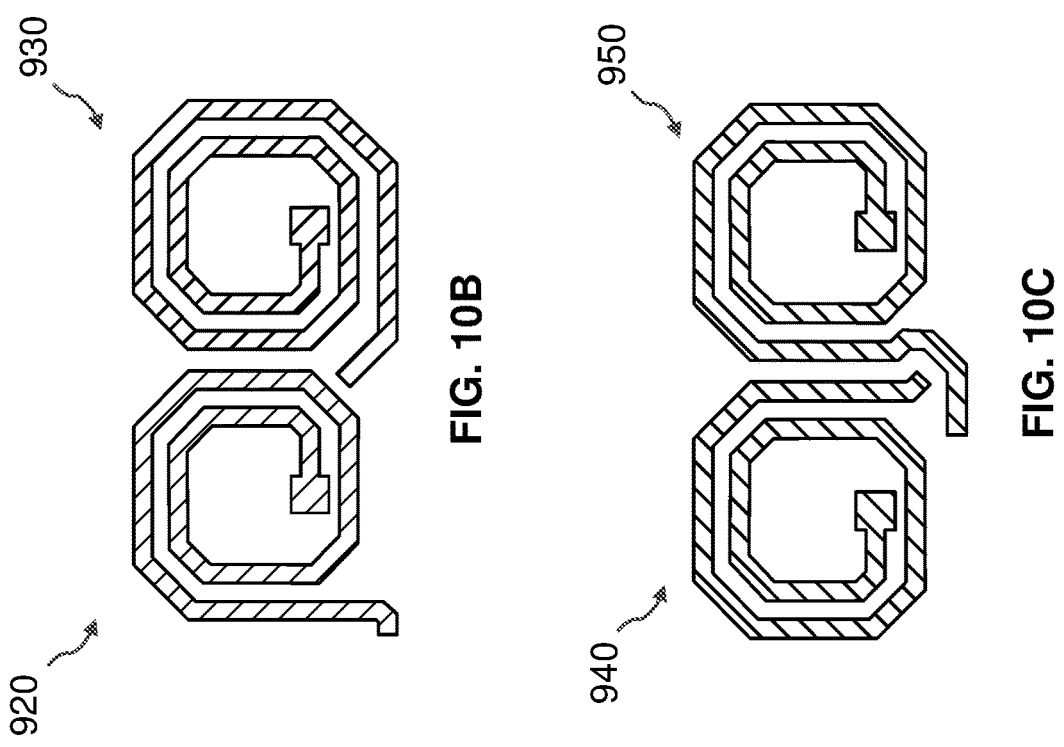
FIG. 10B
FIG. 10C
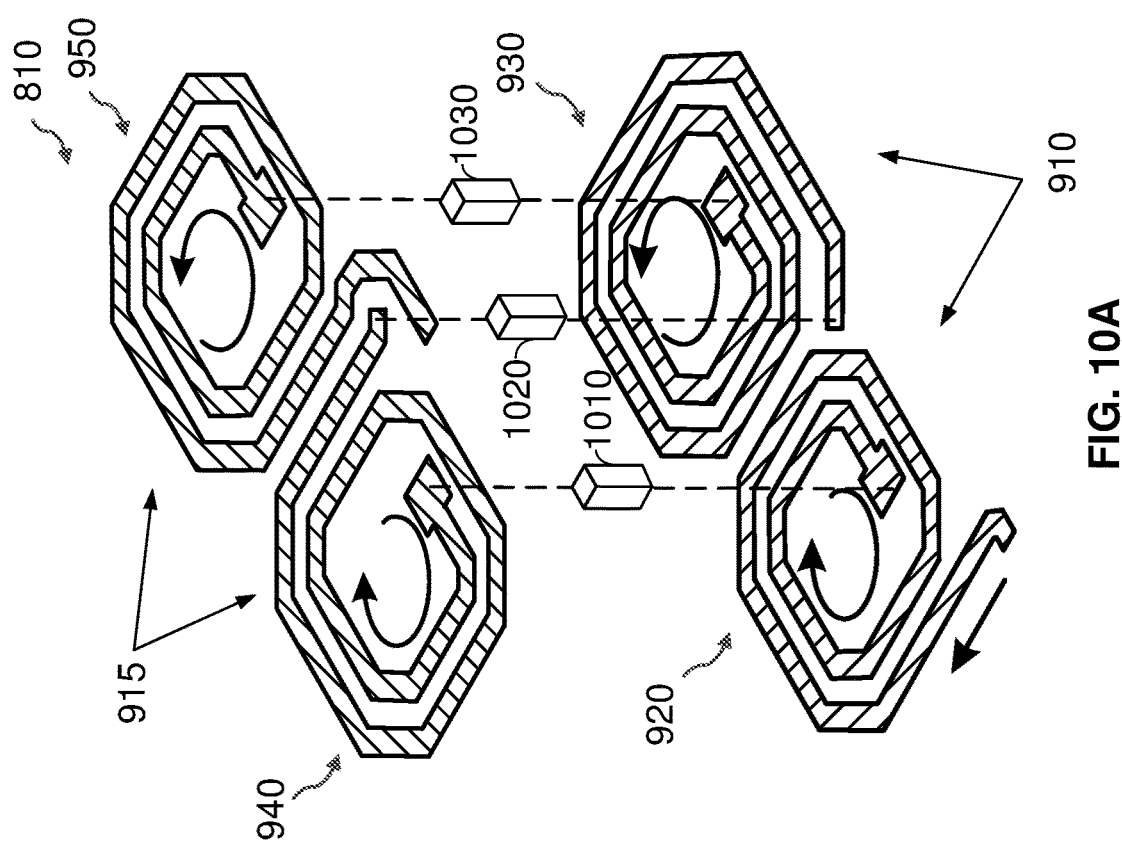
FIG. 10A

1120

1130

1140

1150

2100

2110

Pattern a first metal layer to form a first quadrupole inductor

2120

Pattern a second metal layer to form a second quadrupole inductor, wherein the second quadrupole inductor overlaps the first quadrupole inductor

LOW EMISSION THREE-DIMENSIONAL MULTIPLEXER COMPRISING AN INDUCTOR STRUCTURE HAVING MULTIPLE QUADRUPOLE OR DIPOLE INDUCTORS

BACKGROUND

Field

Aspects of the present disclosure relate generally to wireless communications, and, more particularly, to frequency multiplexers in wireless communications.

Background

A frequency multiplexer may be used in a wireless device to combine two or more signals in different frequency bands, and output the combined signals to a common channel (e.g., a common transmission line). The frequency multiplexer may also be used to receive two or more signals in different frequency bands via the common channel, split the two or more signals, and output each of the two or more signals at a respective port. The common channel may be coupled to one or more antennas and/or coupled to a module (e.g., a radio frequency (RF) front-end module or an intermediate frequency (IF) module). Examples of a frequency multiplexer include a diplexer, a triplexer, a quadplexer, and the like.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to an apparatus including an inductor structure. The inductor structure includes a first quadrupole inductor, and a second quadrupole inductor, wherein the second quadrupole inductor overlaps the first quadrupole inductor.

A second aspect relates to a frequency multiplexer. The frequency multiplexer includes a first filter coupled between a common port and a first port. The first filter includes an inductor structure having a first terminal and a second terminal, the inductor structure comprising a conductor path between the first terminal and the second terminal. The conductor path includes a first quadrupole inductor, and a second quadrupole inductor, wherein the second quadrupole inductor overlaps the first quadrupole inductor. The frequency multiplexer also includes a second filter coupled between the common port and a second port.

A third aspect relates to an apparatus including an inductor structure. The inductor structure includes a first dipole inductor, and a second dipole inductor, wherein the second dipole inductor overlaps the first dipole inductor.

A fourth aspect relates to a frequency multiplexer. The frequency multiplexer includes a first filter coupled between a common port and a first port. The first filter includes an inductor structure having a first terminal and a second terminal, the inductor structure comprising a conductor path between the first terminal and the second terminal. The conductor path includes a first dipole inductor, and a second dipole inductor, wherein the second dipole inductor overlaps the first dipole inductor. The frequency multiplexer also includes a second filter coupled between the common port and a second terminal.

A fifth aspect relates to a method of fabricating an inductor structure. The method includes patterning a first metal layer to form a first quadrupole inductor, and patterning a second metal layer to form a second quadrupole inductor, wherein the second quadrupole inductor overlaps the first quadrupole inductor.

BRIEF DESCRIPTION OF THE DRAWINGS

FIG. 10A shows a perspective view of an exemplary implementation of inductors in the inductor structure of FIG. 9 according to certain aspects of the present disclosure.

FIG. 10B shows a top view of two of the inductors shown in FIG. 10A according to certain aspects of the present disclosure.

FIG. 10C shows a top view of another two of the inductors shown in FIG. 10A according to certain aspects of the present disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts where like features are denoted by the same reference labels throughout the detail description of the drawings. However, it will be apparent to those skilled in the art that these concepts may be practiced without these specific details. In some instances, well-known structures and components are shown in block diagram form in order to avoid obscuring such concepts.

Figure 1:
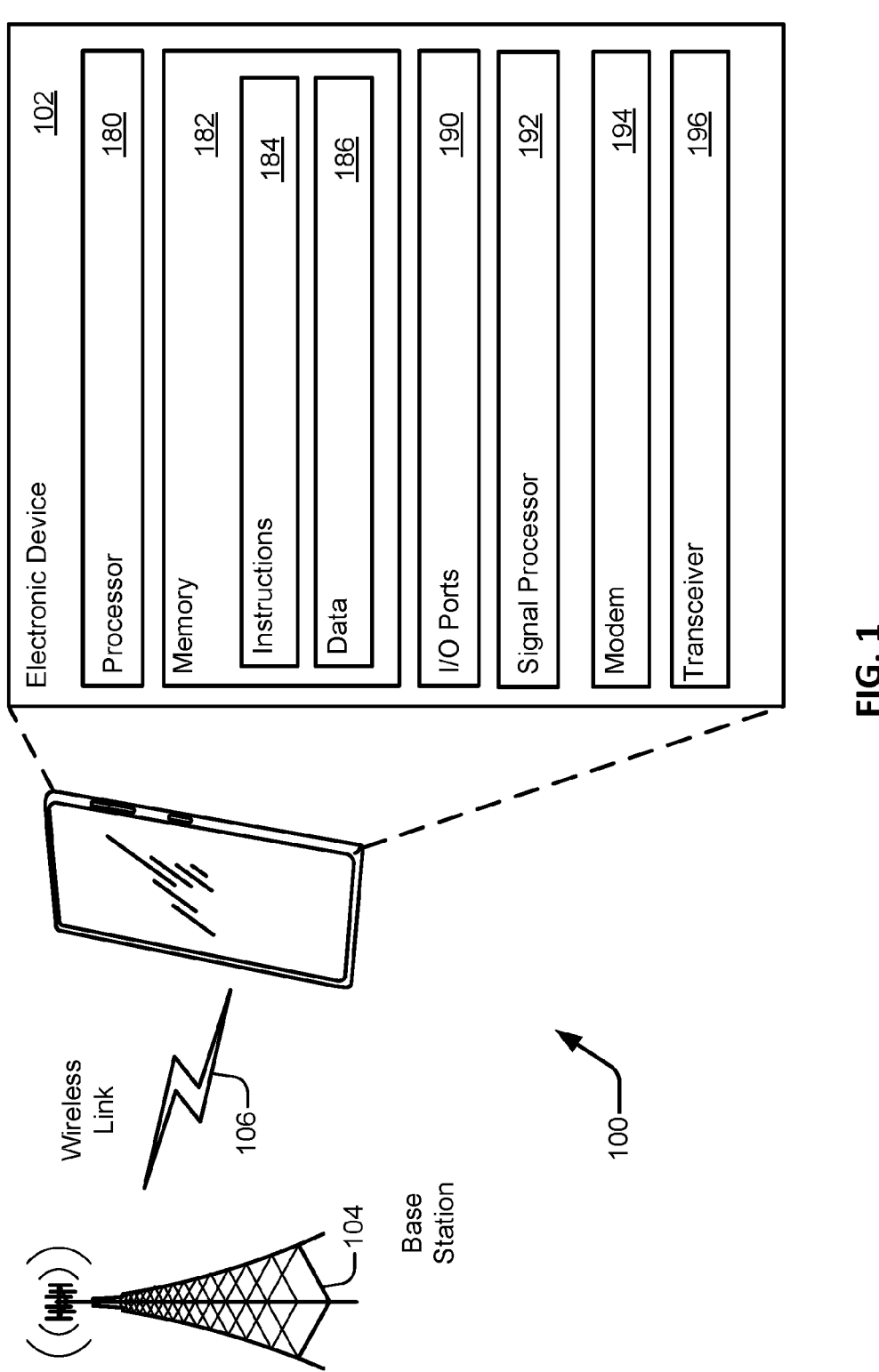
FIG. 1 is a diagram of an environment including an electronic device that includes a transceiver according to certain aspects of the present disclosure.

FIG. 1 is a diagram of an environment 100 including an electronic device 102 that includes a transceiver 196. In the environment 100, the electronic device 102 communicates with a base station 104 through a wireless link 106. As shown, the electronic device 102 is depicted as a smart phone. However, the electronic device 102 may be implemented as any suitable computing or other electronic device, such as a cellular base station, a broadband router, an access point, a cellular or mobile phone, a gaming device, a navigation device, a media device, a laptop computer, a desktop computer, a tablet computer, a server computer, a network-attached storage (NAS) device, a smart appliance, a vehicle-based communication system, an Internet of Things (IoT) device, a sensor or security device, an asset tracker, and so forth.

The base station 104 communicates with the electronic device 102 via the wireless link 106, which may be implemented as any suitable type of wireless link. Although depicted as a base station tower of a cellular radio network, the base station 104 may represent or be implemented as another device, such as a satellite, a terrestrial broadcast tower, an access point, a peer-to-peer device, a mesh network node, another electronic device generally as described above, and so forth. The wireless link 106 can include a downlink of data and/or control information communicated from the base station 104 to the electronic device 102. The wireless link 106 may also include an uplink of data and/or control information communicated from the electronic device 102 to the base station 104. The wireless link 106 may be implemented using any suitable communication protocol or standard, such as 3rd Generation Partnership Project (3GPP) Long-Term Evolution (LTE), 3GPP New Radio (NR), Fifth Generation (5G), Institute of Electrical and Electronics Engineers (IEEE) 802.11, IEEE 802.1, Bluetooth™, and so forth.

The electronic device 102 includes a processor 180 and a memory 182. The memory 182 may be or form a portion of a computer readable storage medium. The processor 180 may include any type of processor, such as an application processor or a multi-core processor, that is configured to execute processor-executable instructions (e.g., code) stored by the memory 182. The memory 182 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the memory 182 is implemented to store instructions 184, data 186, and other information of the electronic device 102, and thus when configured as or part of a computer readable storage medium, the memory 182 does not include transitory propagating signals or carrier waves.

The electronic device 102 may also include input/output (I/O) ports 190. The I/O ports 190 enable data exchanges or interaction with other devices, networks, or users or between components of the device.

The electronic device 102 may further include a signal processor (SP) 192 (e.g., such as a digital signal processor (DSP)). The signal processor 192 may function similar to the processor and may be capable of executing instructions and/or processing information in conjunction with the memory 182.

For communication purposes, the electronic device 102 also includes a modem 194, the transceiver 196, and one or more antennas (not shown in FIG. 1). The transceiver 196 provides connectivity to respective networks and other electronic devices connected therewith using radio frequency (RF) signals. The transceiver 196 may facilitate communication over any suitable type of wireless network, such as a wireless local area network (LAN) (WLAN), a peer to peer (P2P) network, a mesh network, a cellular network, a wireless wide area network (WWAN), a navigational network (e.g., the Global Positioning System (GPS) of North America or another Global Navigation Satellite System (GNSS)), and/or a wireless personal area network (WPAN).

The electronic device 102 may include a frequency multiplexer (not shown in FIG. 1). The frequency multiplexer (e.g., diplexer) may be configured to combine two or more signals in different frequency bands, and output the combined signals to a common channel (e.g., a common transmission line). The frequency multiplexer may also be configured to receive two or more signals in different frequency bands via the common channel, split the two or more signals, and output each of the two or more signals at a respective port. It is to be appreciated that the electronic device 102 may include multiple frequency multiplexers in some implementations.

Figure 2:
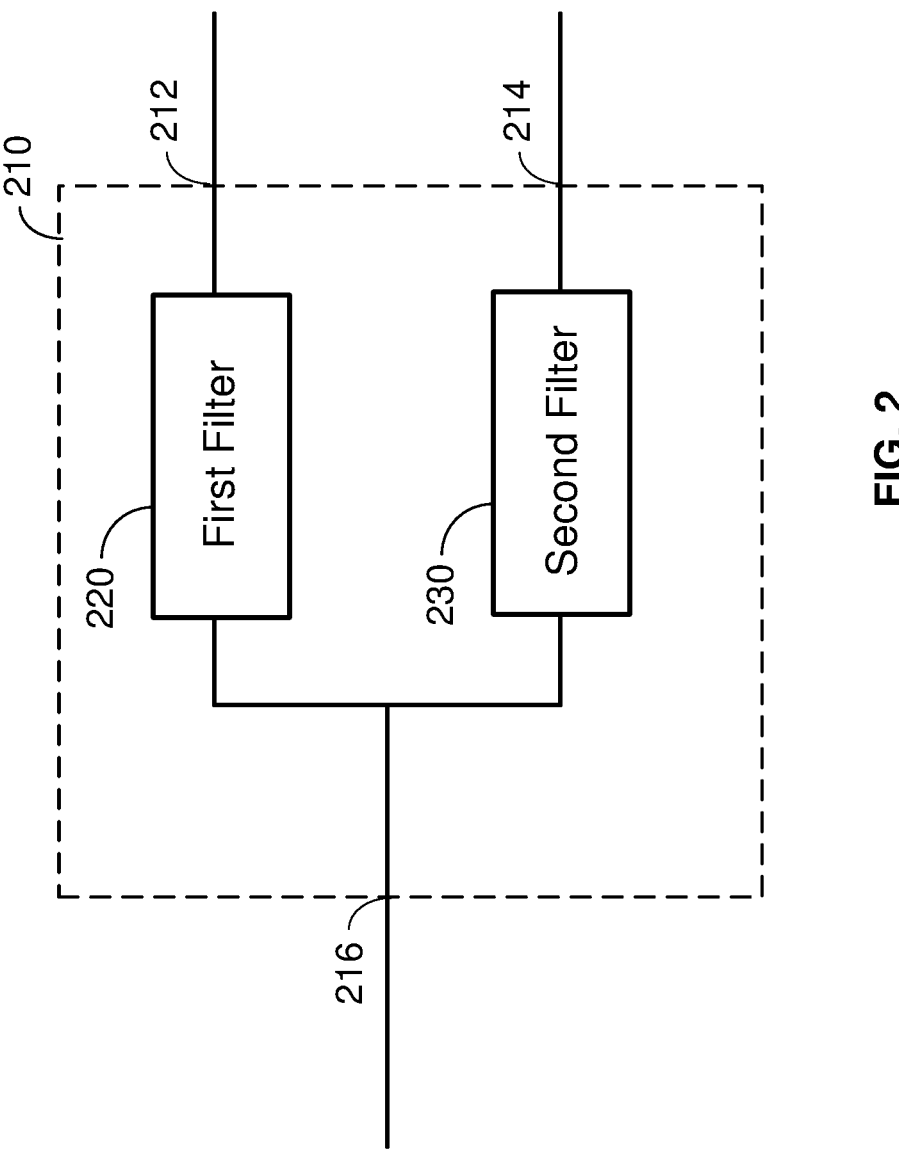
FIG. 2 shows a block diagram of an exemplary frequency multiplexer according to certain aspects of the present disclosure.

FIG. 2 shows a block diagram of an exemplary frequency multiplexer 210 according to certain aspects. In this example, the frequency multiplexer 210 is a diplexer including a first port 212, a second port 214, and a common port 216. However, it is to be appreciated that the frequency multiplexer 210 is not limited to this example.

The frequency multiplexer 210 includes a first filter 220 coupled between the first port 212 and the common port 216, and a second filter 230 coupled between the second port 214 and the common port 216. In certain aspects, the first filter 220 is configured to pass signals in a first frequency band and the second filter 230 is configured to pass signals in a second frequency band, in which the first frequency band and the second frequency band are nonoverlapping. The first filter 220 is also configured to block signals in the second frequency band and the second filter 230 is configured to block signals in the first frequency band. This allows the frequency multiplexer 210 to receive signals in the first and second frequency bands at the common port 216, and separate the signals at the first port 212 and the second port 214.

In one example, the first frequency band is lower than the second frequency band. In this example, the first filter 220 may be implemented with a low pass filter and the second filter 230 may be implemented with a high pass filter. However, it is to be appreciated that the frequency multiplexer 210 is not limited to this example.

In operation, the frequency multiplexer 210 may be configured to receive a first signal in the frequency band at the first port 212, receive a second signal in the second frequency band at the second port 214, and combine the first signal and the second signal. The frequency multiplexer 210 may then output the combined first and second signals to a common channel (e.g., a common transmission line) via the common port 216. In this example, the first filter 220 (e.g., low pass filter) passes the first signal in the first frequency band from the first port 212 to the common port 216 while blocking the second signal in the second frequency band from the first port 212. Also, in this example, the second filter 230 (e.g., high pass filter) passes the second signal in the second frequency band from the second port 214 to the common port 216 while blocking the first signal in the first frequency band from the second port 214.

The frequency multiplexer 210 may also be configured to receive a first signal in the first frequency band and a second signal in the second frequency band at the common port 216, and split (i.e., separate) the first signal and the second signal using the filters first filter 220 and the second filter 230. The frequency multiplexer 210 may then output the first signal at the first port 212 and output the second signal at the second port 214. In this example, the first filter 220 (e.g., low pass filter) passes the first signal in the first frequency band from the common port 216 to the first port 212 while blocking the second signal in the second frequency band. Also, in this example, the second filter 230 (e.g., high pass filter) passes the second signal in the second frequency band from the common port 216 to the second port 214 while blocking the first signal in the first frequency band.

Figure 3:
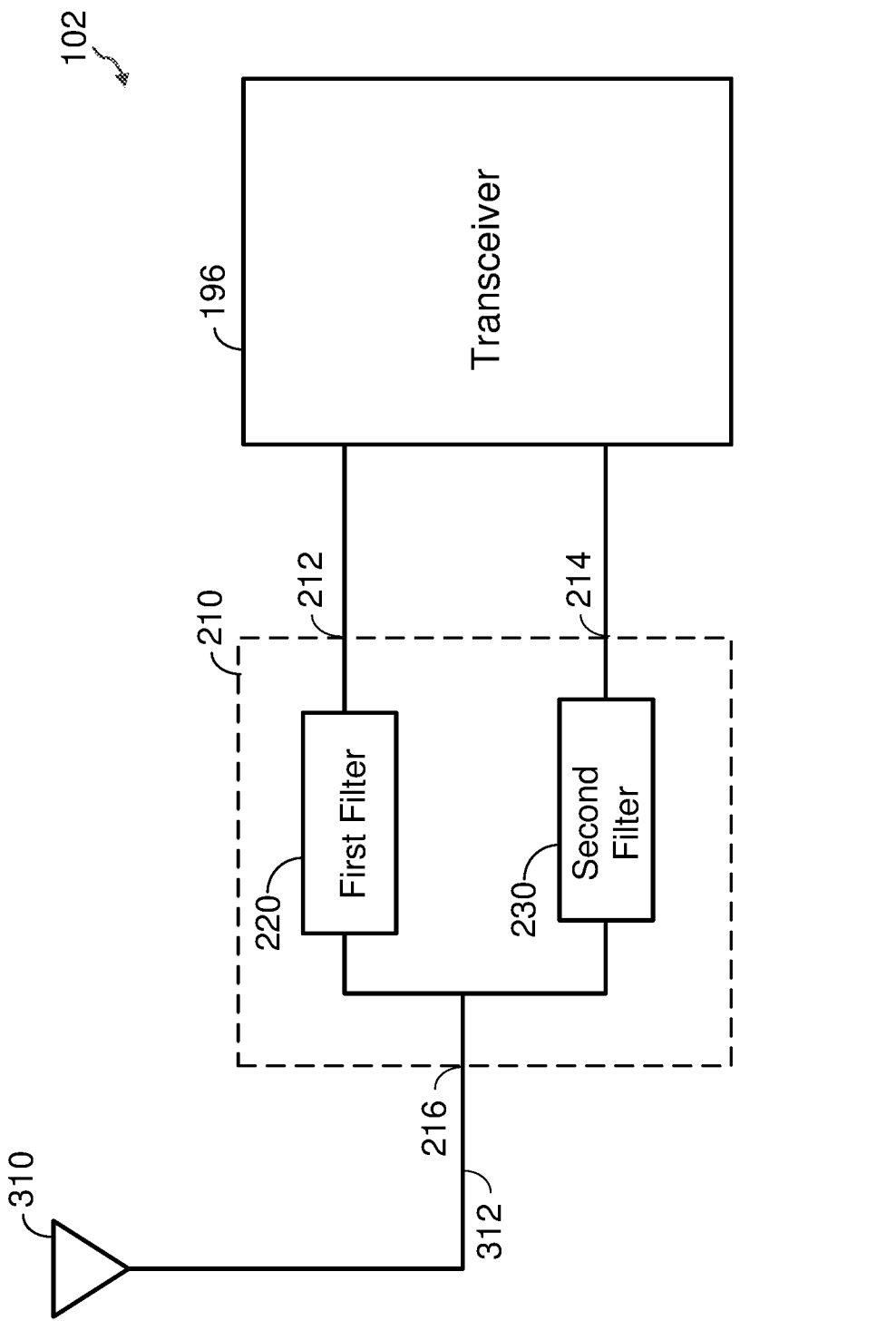
FIG. 3 shows an example of the frequency multiplexer of FIG. 2 coupled to an antenna and a transceiver according to certain aspects of the present disclosure.

FIG. 3 shows an example in which the common port 216 of the frequency multiplexer 210 is coupled to an antenna 310 via a transmission line 312 (also referred to as a feedline). In this example, the common port 216 may also be referred to as an antenna port since the common port 216 is coupled to the antenna 310 in this example. The antenna 310 may be implemented with a patch antenna, a dipole antenna, or another type of antenna. In this example, the first port 212 and the second port 214 are coupled to the transceiver 196.

In this example, the frequency multiplexer 210 allows the transceiver 196 to transmit and/or receive signals in the first frequency band and the second frequency band via a common antenna (i.e., the antenna 310). In some implementations, the transceiver 196 may support multiple wireless communication technologies, in which the first frequency band and the second frequency band are used for different ones of the wireless communication technologies. The wireless communication technologies may include two or more of the following: a third generation (3G) technology (e.g., CDMA), a fourth generation (4G) technology (also known as long term evolution (LTE)), a fifth generation (5G) technology, one or more technologies based on one or more IEEE 802.11 protocols (e.g., IEEE 802.11ac, IEEE 802.11n, IEEE 802.11ad, IEEE 802.11ax, IEEE 802.11ay, etc.), and/or one or more other technologies. In other implementations, the first frequency band and the second frequency band may be used for the same communication technology. The first frequency band and/or the second frequency band may be in a millimeter wave (mmW) frequency band and/or another frequency band. Examples of mmW frequency bands include mmW frequency bands used in fifth-generation standards. In some implementations, the first frequency band and the second frequency band may be in the frequency range 3 (FR3) (e.g., 7.125 GHz to 24.250 GHZ).

To transmit a first signal (e.g., a first radio frequency (RF) signal) in the first frequency band, the transceiver 196 may output the first signal to the first port 212 of the frequency multiplexer 210. The frequency multiplexer 210 passes the first signal in the first frequency band to the antenna 310 via the first filter 220 while blocking the first signal from the second port 214. To transmit a second signal (e.g., a second RF signal) in the second frequency band, the transceiver 196 may output the second signal to the second port 214 of the frequency multiplexer 210. The frequency multiplexer 210 passes the second signal in the second frequency band to the antenna 310 via the second filter 230 while blocking the second signal from the first port 212.

To receive a first signal in the first frequency band, the frequency multiplexer 210 receives the first signal from the antenna 310 at the common port 216, and passes the first signal via the first filter 220 to the transceiver 196 via the first port 212 while blocking the first signal from the second port 214. To receive a second signal in the second frequency band, the frequency multiplexer 210 receives the second signal from the antenna 310 at the common port 216, and passes the second signal via the second filter 230 to the transceiver 196 via the second port 214 while blocking the second signal from the first port 212.

Figure 4:
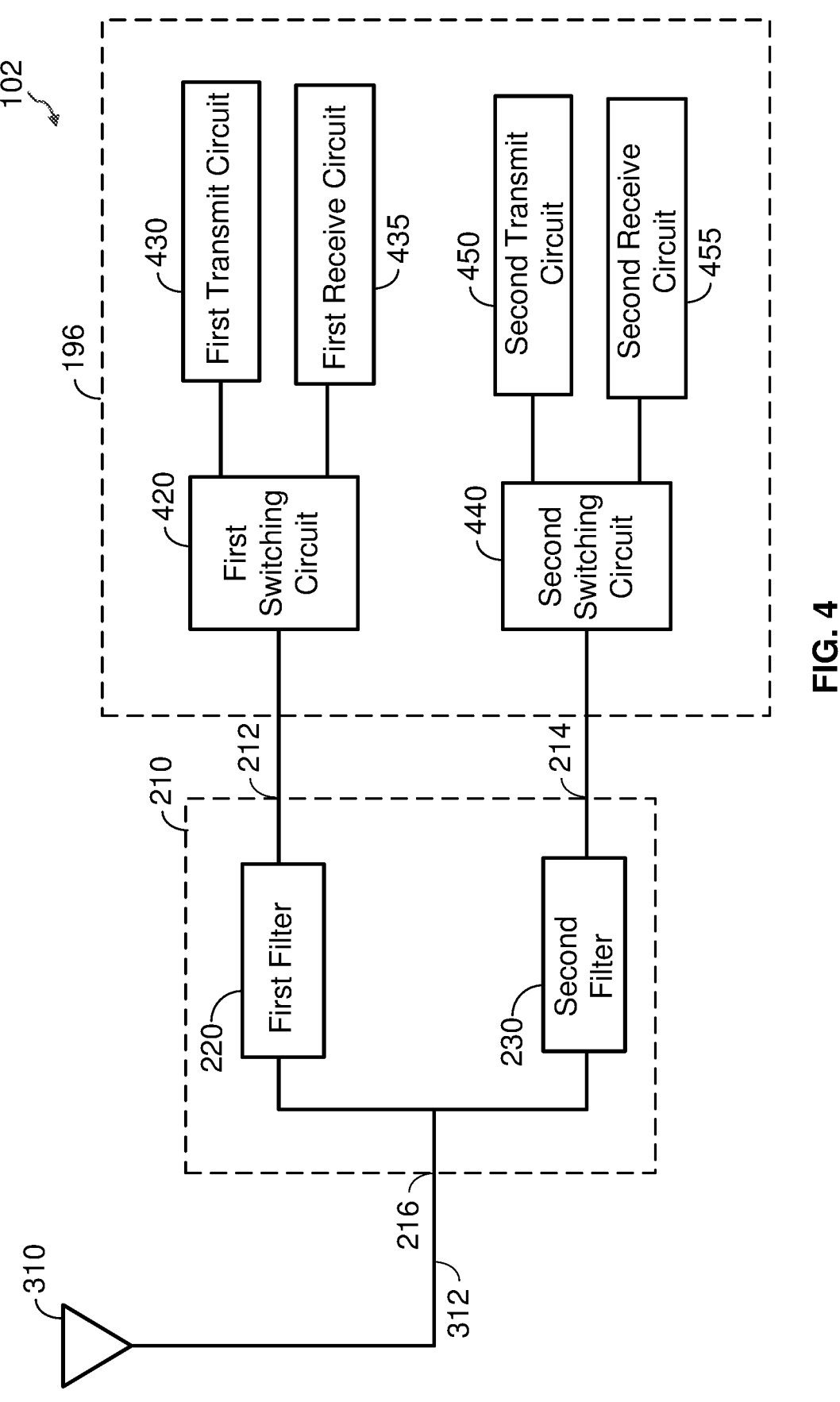
FIG. 4 shows an exemplary implementation of the transceiver of FIG. 3 according to certain aspects of the present disclosure.

FIG. 4 shows an exemplary implementation of the transceiver 196 according to certain aspects. In this example, the transceiver 196 includes a first switching circuit 420, a first transmit circuit 430, and a first receive circuit 435. The first switching circuit 420 may be implemented with a single pole double throw (SP2T) switch or another type of switch. The first switching circuit 420 is coupled to the first port 212 of the frequency multiplexer 210, the first transmit circuit 430, and the first receive circuit 435. The first switching circuit 420 is configured to selectively couple the first transmit circuit 430 or the first receive circuit 435 to the first port 212 of the frequency multiplexer 210 based on a first select signal.

In this example, the first transmit circuit 430 may be configured to receive a baseband signal (e.g., from the modem 194, FIG. 1) or an intermediate frequency (IF) signal, process the baseband signal or the IF signal into a radio frequency (RF) signal in the first frequency band, and output the RF signal to the first switching circuit 420. In this case, the first select signal may cause the first switching circuit 420 to couple the RF signal to the first port 212 of the frequency multiplexer 210 for transmission via the antenna 310. The processing performed by the first transmit circuit 430 may include frequency upconversion, filtering, amplification, and the like. The RF signal in the first frequency band may correspond to the first signal in the first frequency band discussed above.

In this example, the first receive circuit 435 may be configured to receive an RF signal in the first frequency band from the first switching circuit 420, and process the RF signal into a baseband signal or an IF signal. In this case, the first select signal may cause the first switching circuit 420 to couple the first port 212 of the frequency multiplexer 210 to the first receive circuit 435 so that the first receive circuit 435 can receive the RF signal from the antenna 310 through the frequency multiplexer 210. The processing performed by the first receive circuit 435 may include frequency downconversion, filtering, amplification, and the like.

In this example, the transceiver 196 also includes a second switching circuit 440, a second transmit circuit 450, and a second receive circuit 455. The second switching circuit 440 may be implemented with an SP2T switch or another type of switch. The second switching circuit 440 is coupled to the second port 214 of the frequency multiplexer 210, the second transmit circuit 450, and the second receive circuit 455. The second switching circuit 440 is configured to selectively couple the second transmit circuit 450 or the second receive circuit 455 to the second port 214 of the frequency multiplexer 210 based on a second select signal.

In this example, the second transmit circuit 430 may be configured to receive a baseband signal (e.g., from the modem 194) or an IF signal, process the baseband signal or the IF signal into an RF signal in the second frequency band, and output the RF signal to the second switching circuit 440. In this case, the second select signal may cause the second switching circuit 440 to couple the RF signal to the second port 214 of the frequency multiplexer 210 for transmission via the antenna 310. The processing performed by the second transmit circuit 450 may include frequency upconversion, filtering, amplification, and the like. The RF signal in the second frequency band may correspond to the second signal in the second frequency band discussed above.

In this example, the second receive circuit 455 may be configured to receive an RF signal in the second frequency band from the first switching circuit 420, and process the RF signal into a baseband signal or an IF signal. In this case, the second select signal may cause the second switching circuit 440 to couple the second port 214 of the frequency multiplexer 210 to the second receive circuit 455 so that the second receive circuit 455 can receive the RF signal from the antenna 310 through the frequency multiplexer 210. The processing performed by the second receive circuit 455 may include frequency downconversion, filtering, amplification, and the like.

Figure 5:
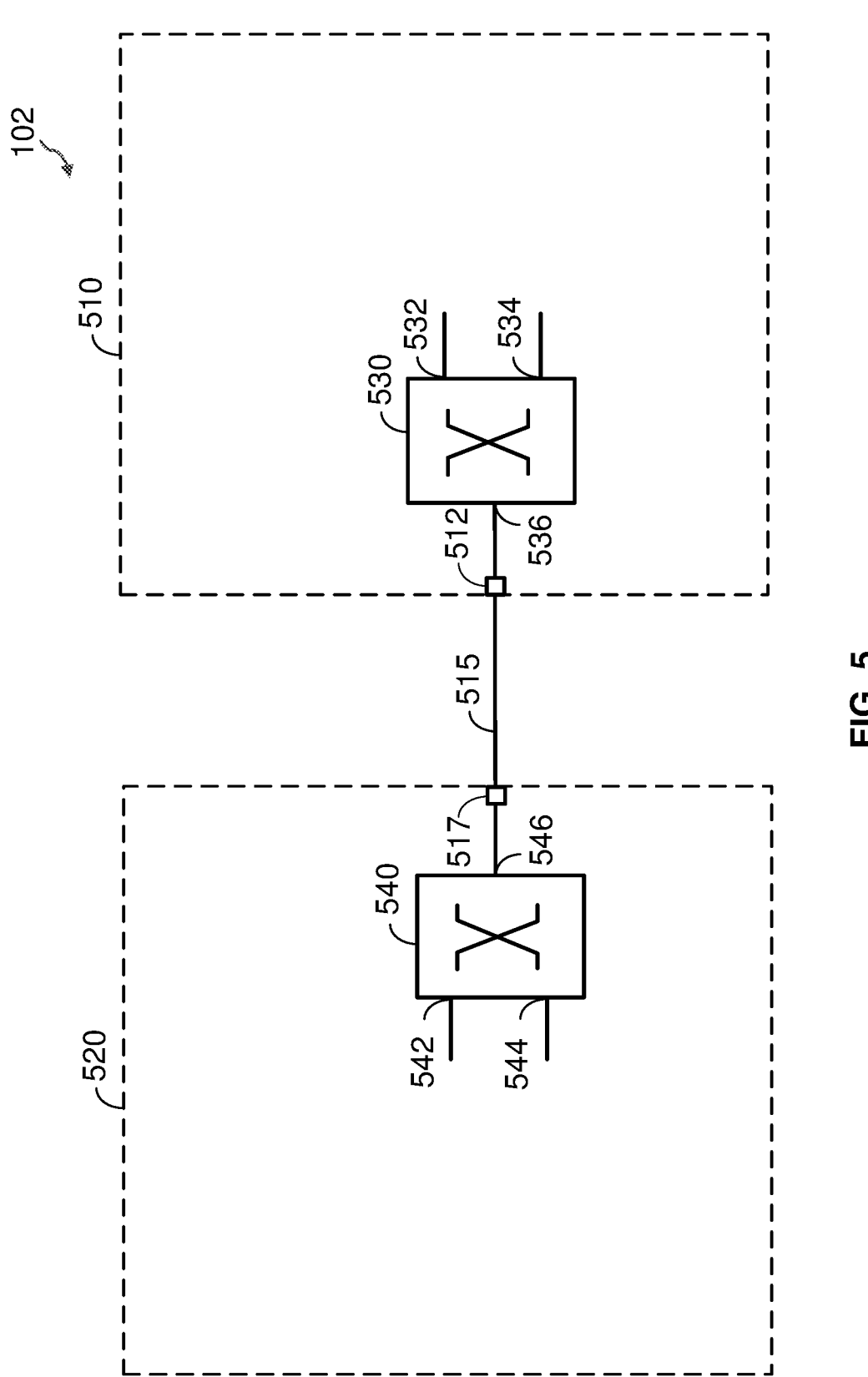
FIG. 5 shows an example of modules including frequency multiplexers according to certain aspects of the present disclosure.

In certain aspects, frequency multiplexers may be used provide frequency domain multiplexing for two or more modules. In this regard, FIG. 5 shows an example in which the electronic device 102 includes a first module 510 and a second module 520. In some implementations, the first module 510 is an RF front-end module and the second module 520 is an IF module. However, it is to be appreciated that the present disclosure is not limited to this example. A module may include one or more chips in which components of the module are integrated on the one or more chips.

In this example, the first module 510 includes a first frequency multiplexer 530 and the second module 520 includes a second frequency multiplexer 540. Each of the first frequency multiplexer 530 and the second frequency multiplexer 540 may be implemented with a separate instance of the frequency multiplexer 210. Although FIG. 5 shows each of the modules 510 and 520 including one frequency multiplexer (i.e., a respective one of the first frequency multiplexer 530 and the second frequency multiplexer 540), it is to be appreciated that each of the first module 510 and the second module 520 may include multiple frequency multiplexers.

In the example shown in FIG. 5, the first frequency multiplexer 530 includes a first port 532, a second port 534, and a common port 536. For the example where the first frequency multiplexer 530 is implemented with an instance of the frequency multiplexer 210, the first port 532 corresponds to the first port 212, the second port 534 corresponds to the second port 214, and the common port 536 corresponds to the common port 216. In this example, the first module 510 includes an interface 512 coupled to the common port 536. The interface 512 is configured to couple the common port 536 to a transmission line 515 (e.g., a cable, a fiber, etc.) between the first module 510 and the second module 520, as discussed further below. The interface 512 may be implemented with any structure configured to couple the first module 510 to the transmission line 515 including a pad, a pin, a cable or fiber connector, and the like.

The second frequency multiplexer 540 includes a first port 542, a second port 544, and a common port 546. For the example where second frequency multiplexer 540 is implemented with an instance of the frequency multiplexer 210, the first port 542 corresponds to the first port 212, the second port 544 corresponds to the second port 214, and the common port 546 corresponds to the common port 216. In this example, the second module 520 includes an interface 517 coupled to the common port 546. The interface 517 is configured to couple the common port 546 to the transmission line 515. The interface 517 may be implemented with any structure configured to couple the second module 520 to the transmission line 515 including a pad, a pin, a cable or fiber connector, and the like.

In this example, the first frequency multiplexer 530 and the second frequency multiplexer 540 allow the first module 510 and the second module 520 to communicate with each other in the first frequency band and the second frequency band via a common channel (i.e., the transmission line 515). For example, the first frequency multiplexer 530 may receive a first signal in the first frequency band at the first port 532 and receive a second signal in the second frequency band at the second port 534. The first frequency multiplexer 530 may then output the first signal and the second signal to the transmission line 515 via the common port 536. The second frequency multiplexer 540 receives the first signal and the second signal at the common port 546, splits (i.e., separates) the first signal and the second signal, outputs the first signal at the first port 542, and outputs the second signal at the second port 544.

For communication in the other direction, the second frequency multiplexer 540 may receive a first signal in the first frequency band at the first port 542 and receive a second signal in the second frequency band at the second port 544. The second frequency multiplexer 540 may then output the first signal and the second signal to the transmission line 515 via the common port 546. The first frequency multiplexer 530 receives the first signal and the second signal at the common port 536, splits (i.e., separates) the first signal and the second signal, outputs the first signal at the first port 532, and outputs the second signal at the second port 534.

Figure 6A:
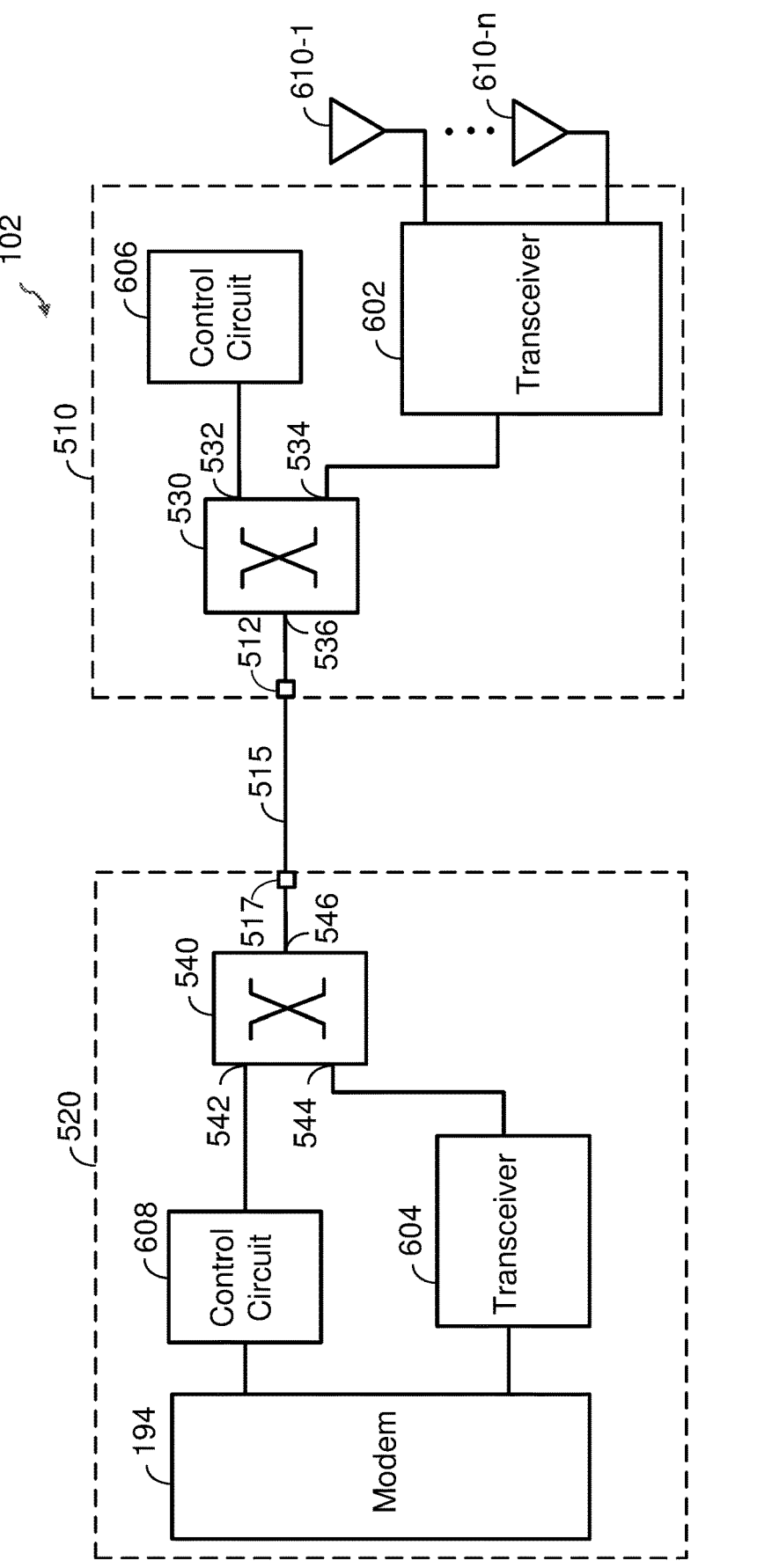
FIG. 6A shows an example where the modules of FIG. 5 include transceivers according to certain aspects of the present disclosure.

FIG. 6A shows an example where the first module 510 includes RF front-end circuitry and the second module 520 includes IF circuitry according to certain aspects. In this example, the first module 510 includes a transceiver 602 and a control circuit 606. The transceiver 602 is coupled to the second port 534 of the first frequency multiplexer 530 and one or more antennas 610-1 to 610-*n*. The control circuit 606 is coupled to the first port 532 of the first frequency multiplexer 530. Also, in this example, the second module 520 includes a transceiver 604 and a control circuit 608. The transceiver 604 is coupled to the second port 544 of the second frequency multiplexer 540 and the modem 194. The control circuit 608 is coupled to the first port 542 of the second frequency multiplexer 540. The transceivers 602 and 604 may be part of the transceiver 196.

In operation, the transceiver 602 may be configured receive one or more RF signals via the one or more antennas 610-1 and 610-*n*, process the one or more RF signals into an IF signal in the second frequency band, and output the IF signal in the second frequency band to the second port 534 of the first frequency multiplexer 530. The first frequency multiplexer 530 may then send the IF signal to the second module 520 via the transmission line 515. The processing performed by the transceiver 602 may include beamforming, frequency downconversion from RF to IF, amplification, filtering, or any combination thereof. The second frequency multiplexer 540 receives the IF signal in the second frequency band at the common port 546 and passes the IF signal to the transceiver 604 via the second port 544. The transceiver 604 may be configured to process the IF signal into a baseband signal, and output the baseband signal to the modem 194 for further processing. Processing performed by the transceiver 604 may include frequency down conversion from IF to baseband, filtering, amplification, or any combination thereof.

In the other direction, the transceiver 604 may be configured receive a baseband signal from the modem 194, process the baseband signal into an IF signal in the second frequency band, and output the IF signal in the second frequency band to the second port 544 of the second frequency multiplexer 540. The second frequency multiplexer 540 may then send the IF signal to the first module 510 via the transmission line 515. The processing performed by the transceiver 604 may include frequency upconversion from baseband to IF, amplification, filtering, or any combination thereof. The first frequency multiplexer 530 receives the IF signal in the second frequency band at the common port 536 and passes the IF signal to the transceiver 602 via the second port 534. The transceiver 602 may be configured to process the IF signal into one or more RF signals, and output the one or more RF signals to the one or more antennas 610-1 to 610-*n* for transmission. Processing performed by the transceiver 602 may include frequency up conversion from IF to RF, filtering, amplification, beamforming (e.g., to electronically steer the direction of transmission), or any combination thereof.

The control circuits 606 and 608 may be configured to synchronize operations between the first module 510 and the second module 520. To do this, the control circuits 606 and 608 may be configured to send control and/or clock signals to each other via the transmission line 515. The control and/or clock signals are in the first frequency band, which is lower than the second frequency band. In this example, the frequency multiplexers 530 and 540 are able to separate the control and/or clock signals in the first frequency band from the IF signals in the second frequency band, allowing the control and/or clock signals and the IF signals to be sent across a common transmission line (i.e., transmission line 515) between the modules 510 and 520.

Figure 6B:
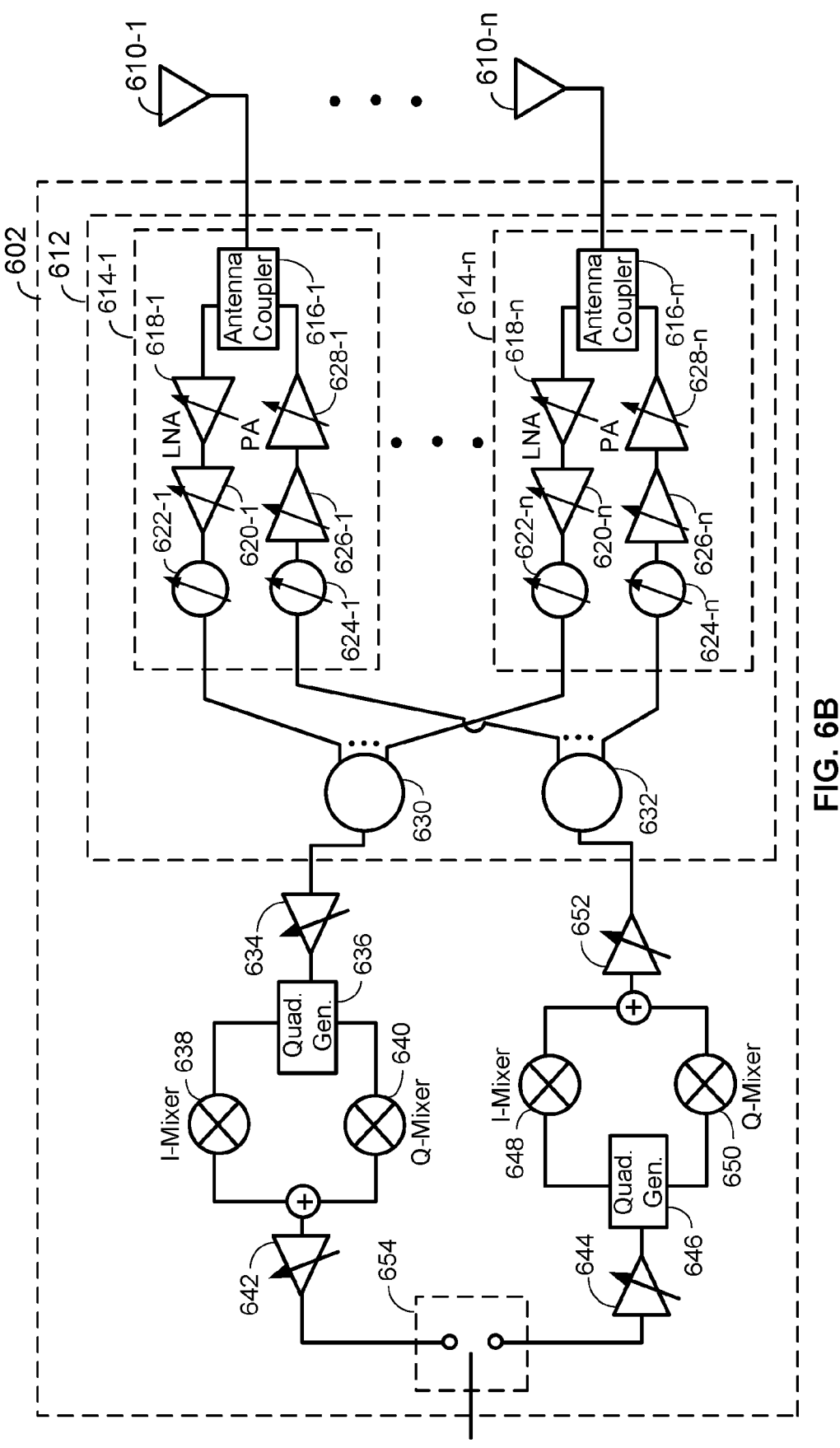
FIG. 6B shows an exemplary implementation of one of the transceivers of FIG. 6A according to certain aspects of the present disclosure.

FIG. 6B shows an exemplary implementation of the transceiver 602 in the first module 510 (FIG. 6A) according to certain aspects. In this example, the transceiver 602 includes a beamformer 612 including multiple branches 614-1 to 614-*n* where each of the branches is coupled to a respective one of the antennas 610-1 to 610-*n*. Each of the branches 614-1 to 614-*n* includes a respective receive chain including a respective low-noise amplifier (LNA) 618-1 to 618-*n*, a respective variable amplifier 620-1 to 620-*n*, and a respective phase shifter 622-1 to 622-*n* coupled in a chain. Each of the branches 614-1 to 614-*n* also includes a respective transmit chain including a respective phase shifter 624-1 to 624-*n*, a respective variable amplifier 626-1 to 626-*n*, and a respective power amplifier (PA) 628-1 to 628-*n* coupled in a chain. Each of the branches 614-1 to 614-*n* also includes a respective antenna coupler 616-1 to 616-*n* for coupling the respective receive chain and the respective transmit chain to the respective one of the antennas 610-1 to 610-*n*. The respective antenna coupler 616-1 to 616-*n* may include a switch, a diplexer, a duplexer, etc. The beamformer 612 also includes a power combiner 630 coupled to the receive chains in the branches 614-1 to 614-*n*, and a power splitter 632 coupled to the transmit chains in the branches 614-1 to 614-*n*. The power combiner 630 is configured to combine the RF signals from the receive chains into a combined RF signal. The power splitter 632 is configured to split an RF signal into multiple RF signals, and output each of the RF signals to a respective one of the transmit chains.

The beamformer 612 is configured to electronically steer a receive beam of the antennas 610-1 to 610-*n* by applying different phase shifts to the RF signals in the receive chains using the phase sifters 622-1 to 622-*n*. The beamformer 612 is also configured to electronically steer a transmit beam of the antennas 610-1 to 610-*n* by applying different phase shifts to the RF signals in the transmit chains using the phase shifters 624-1 to 624-*n*.

In this example, the transceiver 602 also includes a first variable amplifier 634, a first quadrature generator 636, a first mixer 638, a second mixer 640, and a second variable amplifier 642. The input of the first variable amplifier 634 is coupled to the power combiner 630, and the output of the first variable amplifier 634 is coupled to the first quadrature generator 636. The first mixer 638 is coupled between the first quadrature generator 636 and the input of the second variable amplifier 642. The second mixer 640 is coupled between the first quadrature generator 636 and the input of the second variable amplifier 642. In operation, the first variable amplifier 634 is configured to amplify the combined RF signal from the power combiner 630, and the first quadrature generator 636 is configured to generate an in-phase RF signal and a quadrature RF signal based on the amplified combined RF signal, output the in-phase RF signal to the first mixer (I-mixer) 638, and output the quadrature RF signal to the second mixer (Q-mixer) 640. The first mixer 638 mixes the in-phase RF signal with a local oscillator signal to downconvert the in-phase RF signal to an in-phase IF signal. The second mixer 640 mixes the quadrature RF signal with the local oscillator signal to downconvert the quadrature RF signal to a quadrature IF signal. The in-phase IF signal and the quadrature IF signal are combined and amplified by the second variable amplifier 642.

The transceiver 602 also includes a third variable amplifier 644, a second quadrature generator 646, a third mixer 648, a fourth mixer 650, and a fourth variable amplifier 652. The input of the third variable amplifier 644 is configured to receive an IF signal, and the output of the third variable amplifier 644 is coupled to the second quadrature generator 646. The third mixer 648 is coupled between the second quadrature generator 646 and the input of the fourth variable amplifier 652. The fourth mixer 650 is coupled between the second quadrature generator 646 and the input of the fourth variable amplifier 652. In operation, the third variable amplifier 644 is configured to amplify the IF signal, and the second quadrature generator 646 is configured to generate an in-phase IF signal and a quadrature IF signal based on the amplified IF signal, output the in-phase IF signal to the third mixer (I-mixer) 648, and output the quadrature IF signal to the fourth mixer (Q-mixer) 650. The third mixer 648 mixes the in-phase IF signal with a local oscillator signal to upconvert the in-phase IF signal to an in-phase RF signal. The fourth mixer 650 mixes the quadrature IF signal with the local oscillator signal to upconvert the quadrature IF signal to a quadrature RF signal. The in-phase RF signal and the quadrature RF signal are combined and amplified by the fourth variable amplifier 652. The output of the fourth variable amplifier 652 is coupled to the power splitter 632 to output the amplified RF signal to the power splitter 632.

In this example, the transceiver 602 may also include a switching circuit 654 coupled to the output of the second variable amplifier 642, the input of the third variable amplifier 644, and the second port 534 of the frequency multiplexer 530 (shown in FIG. 6A). The switching circuit 654 may include an SP2T switch or another type of switch for selectively coupling the second port 534 of the frequency multiplexer 530 to the output of the second variable amplifier 642 or the input of the third variable amplifier 644.

Figure 6C:
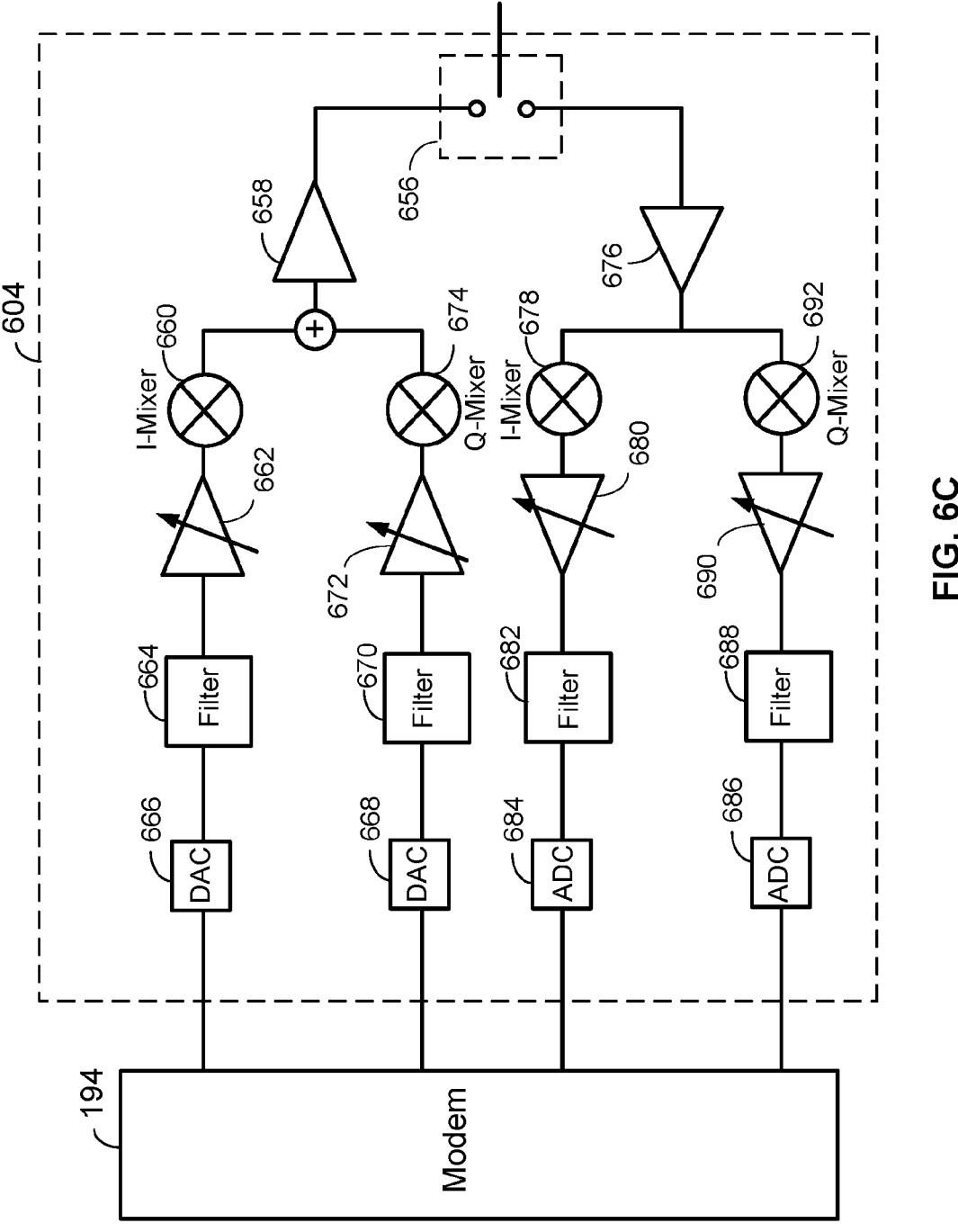
FIG. 6C shows an exemplary implementation of another one of the transceivers of FIG. 6A according to certain aspects of the present disclosure.

FIG. 6C shows an exemplary implementation of the transceiver 604 in the second module 520 according (FIG. 6A) to certain aspects. In this example, the transceiver 604 includes an amplifier 658, a first transmit chain coupled between the modem 194 and the input of the amplifier 658, and a second transmit chain coupled between the modem 194 and the input of the amplifier 658. The first transmit chain includes a first digital-to-analog converter (DAC) 666, a first filter 664, a first variable amplifier 662, and a first mixer (I-mixer) 660 coupled in a chain. The first DAC 666 is configured to convert a digital baseband signal from the modem 194 into an analog baseband signal, the first filter 664 is configured to filter the baseband signal, the first variable amplifier 662 is configured to amplify the baseband signal, and the first mixer 660 is configured to mix the baseband signal with an in-phase local oscillator signal to unconvert the baseband signal to an in-phase IF signal.

The second transmit chain includes a second DAC 668, a second filter 670, a second variable amplifier 672, and a second mixer (Q-mixer) 674 coupled in a chain. The second DAC 668 is configured to convert a digital baseband signal from the modem 194 into an analog baseband signal, the second filter 670 is configured to filter the baseband signal, the second variable amplifier 672 is configured to amplify the baseband signal, and the second mixer 674 is configured to mix the baseband signal with a quadrature local oscillator signal to unconvert the baseband signal to a quadrature IF signal. The quadrature local oscillator signal may be 90 degrees out of phase with the in-phase local oscillator signal. The in-phase IF signal and the quadrature IF signal from the mixers 660 and 674 are combined and amplified by the amplifier 658.

The transceiver 604 also includes an amplifier 676 configured to receive an IF signal and amplify the IF signal, a first receive chain coupled between the output of the amplifier 676 and the modem 194, and a second receive chain coupled between the output of the amplifier 676 and the modem 194.

The first receive chain includes a third mixer 678, a third variable amplifier 680, a third filter 682, and a first analog-to-digital converter (ADC) 684 coupled in a chain. The third mixer (I-mixer) 678 is configured to mix the IF signal with an in-phase local oscillator signal to downconvert the IF signal to an in-phase baseband signal, the third variable amplifier 680 is configured to amplify the in-phase baseband signal, the third filter 682 is configured to filter the in-phase baseband signal, and the first ADC 684 is configured to convert the in-phase baseband signal into a digital signal and output the digital signal to the modem 194.

The second receive chain includes a fourth mixer (Q-mixer) 692, a fourth variable amplifier 690, a fourth filter 688, and a second ADC 686 coupled in a chain. The fourth mixer 692 is configured to mix the IF signal with an quadrature local oscillator signal to downconvert the IF signal to a quadrature baseband signal, the fourth variable amplifier 690 is configured to amplify the quadrature baseband signal, the fourth filter 688 is configured to filter the quadrature baseband signal, and the second ADC 686 is configured to convert the quadrature baseband signal into a digital signal and output the digital signal to the modem 194.

In this example, the transceiver 604 may also include a switching circuit 656 coupled to the output of the amplifier 658, the input of the amplifier 676, and the second port 544 of the frequency multiplexer 540 (shown in FIG. 6A). The switching circuit 656 may include an SP2T switch or another type of switch for selectively coupling the second port 544 of the frequency multiplexer 540 to the output of the amplifier 658 or the input of the amplifier 676.

It is to be appreciated that the transceivers 602 and 604 are not limited to the exemplary implementations shown in FIGS. 6B and 6C.

Figure 7:
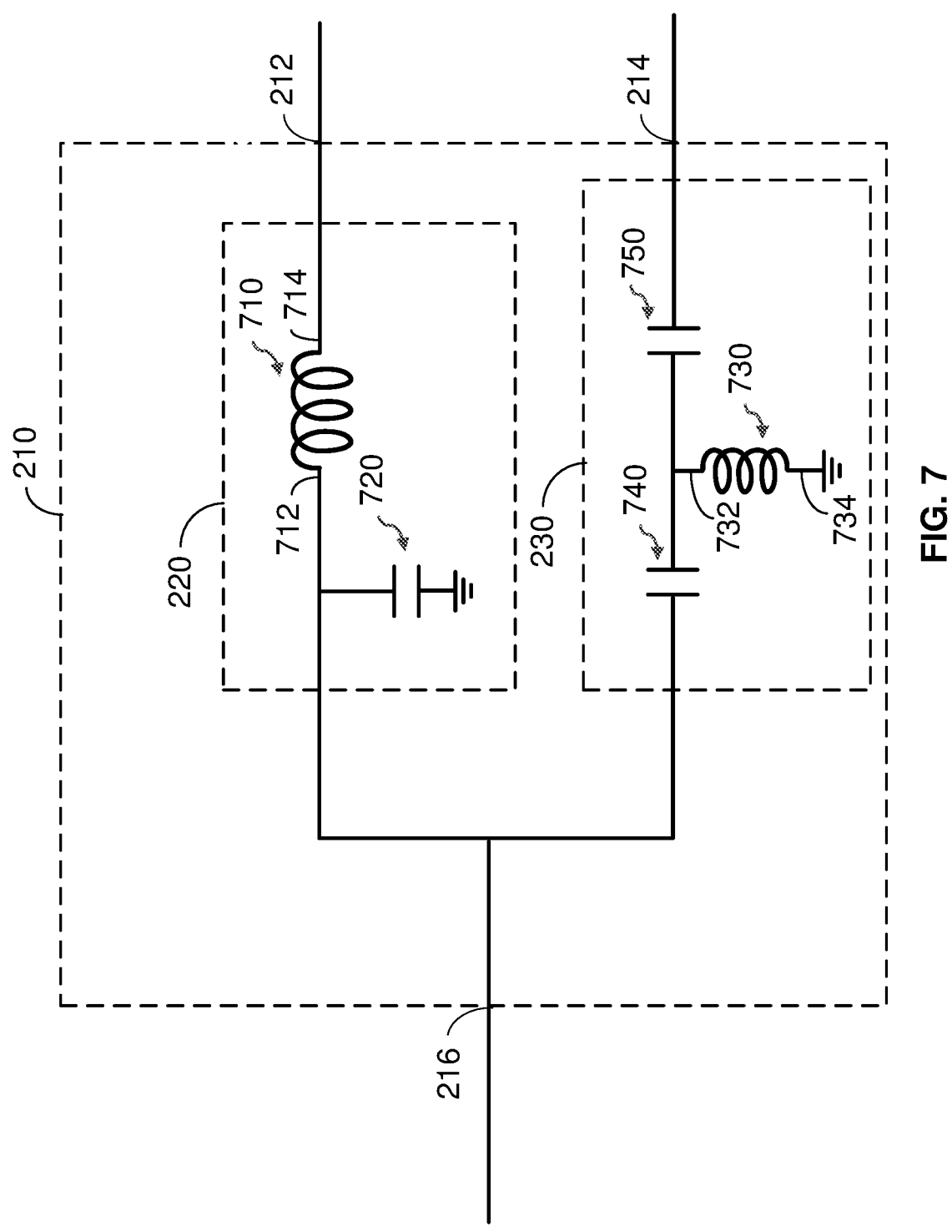
FIG. 7 shows an exemplary implementation of a first filter and a second filter in the frequency multiplexer of FIG. 2 according to certain aspects of the present disclosure.

Returning to FIG. 2, the first filter 220 and the second filter 230 of the frequency multiplexer 210 may include inductors and capacitors (e.g., inductor-capacitor (LC) networks). In this regard, FIG. 7 shows an exemplary implementation of the first filter 220 and the second filter 230 according to certain aspects. In this example, the first filter 220 includes an inductor 710 and a capacitor 720. The inductor 710 is coupled between the common port 216 and the first port 212 with a first terminal 712 of the inductor 710 coupled to the common port 216 and a second terminal 714 of the inductor 710 coupled to the first port 212. The capacitor 720 is coupled between the common port 216 and ground (or some reference potential). In the example shown in FIG. 7, the first filter 220 implements a low pass (LP) filter.

It is to be appreciated that the first filter 220 is not limited to the exemplary implementation shown in FIG. 7. For example, in some implementations, the capacitor 720 may be moved to the other side of the inductor 710. In another example, the first filter 220 may include a second capacitor coupled to the other side of the inductor 710.

In the example shown in FIG. 7, the second filter 230 includes a first capacitor 740, a second capacitor 750, and an inductor 730. In this example, the first capacitor 740 is coupled between the common port 216 and a first terminal 732 of the inductor 730, the second capacitor 750 is coupled between the first terminal 732 of the inductor 730 and the second port 214, and a second terminal 734 of the inductor 730 is coupled to ground (or some reference potential). In the example shown in FIG. 7, the second filter 230 implements a high pass (HP) filter.

It is to be appreciated that the second filter 230 is not limited to the exemplary implementation shown in FIG. 7. For example, in some implementations, one of the capacitors 740 and 750 may be omitted.

A challenge with using inductors in a frequency multiplexer (e.g., frequency multiplexer 210) is that inductors may take up a large area of a chip or substrate, making it difficult to reduce the size of the frequency multiplexer. The inductance of an inductor (e.g., inductor 710) in an LP filter (e.g., the first filter 220) may be much larger than the inductance of an inductor (e.g., inductor 730) in a HP filter (e.g., second filter 230), and therefore may have a larger impact on the size of the frequency multiplexer. Accordingly, reducing the area of the inductor 710 in the first filter 220 while still achieving the inductance needed for low pass filtering is desirable to reduce the size of the frequency multiplexer 210.

Another challenge is that the inductor 710 in the first filter 220 can emit electromagnetic interference at harmonics of the frequencies of signals in the first frequency band (also referred to as harmonic emissions). The harmonics may be within the second frequency band. As a result, the harmonic emissions from the inductor 710 can degrade the performance of components operating in the second frequency band (e.g., the second filter 230, components in the transceiver 602, etc.). Accordingly, reducing harmonic emissions from the inductor 710 is desirable.

To address the above, aspects of the present disclosure provide a three-dimensional inductor structure including a stack of inductors. Stacking the inductors allows the inductor structure to achieve a given inductance in a smaller area. In certain aspects, the inductors form dipole inductors and/or quadrupole inductors, which concentrate the magnetic fields of the inductors within the inductor structure. Forming the inductors as dipole inductors and/or quadrupole inductors, which concentrate the magnetic fields of the inductors within the inductor structure, causes the magnetic fields of the inductors to quickly diminish outside of the inductor structure, and therefore reduce harmonic emissions from the inductor structure. The above features and other features of the inductor structure are discussed further below.

Figure 8:
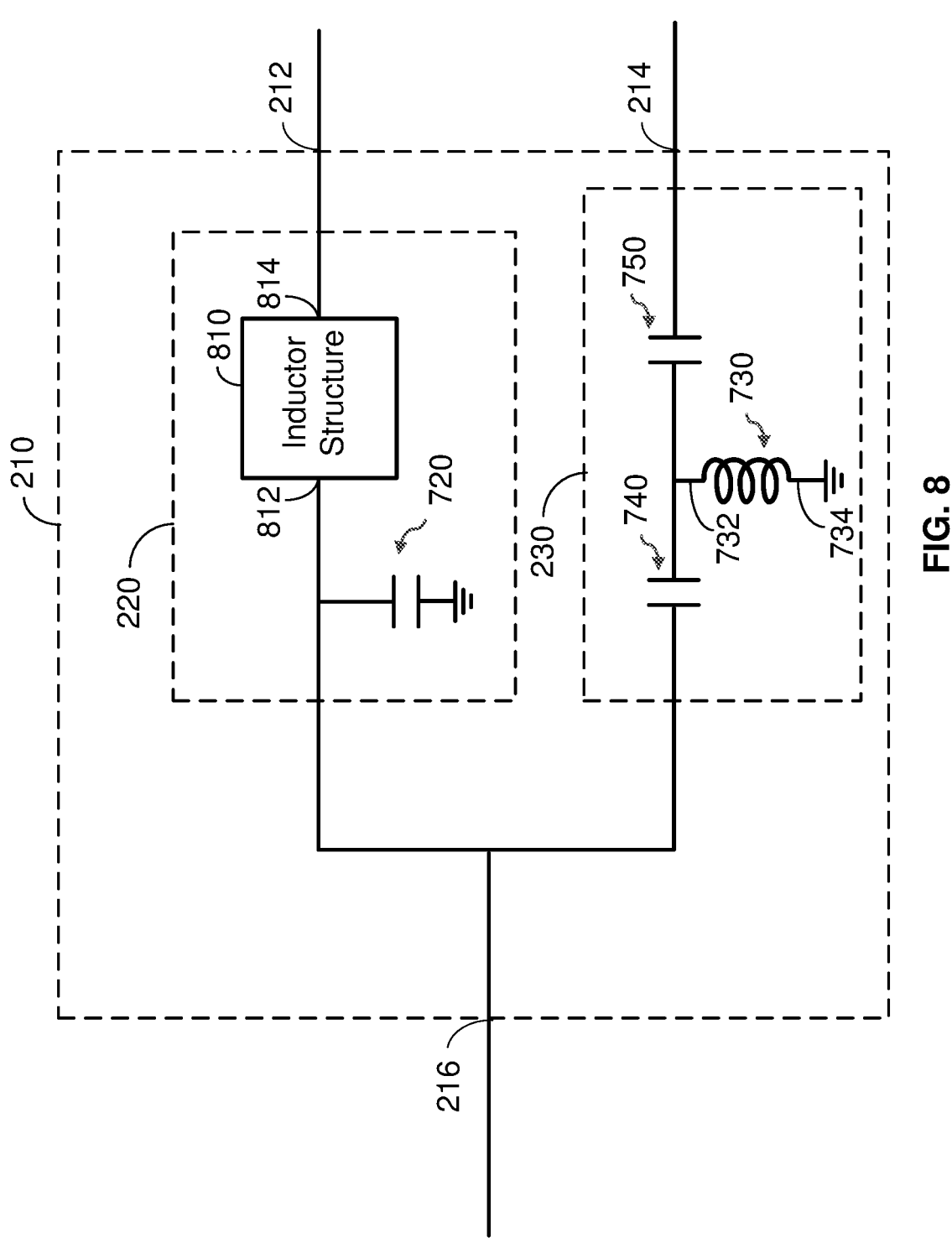
FIG. 8 shows an example of the frequency multiplexer of FIG. 2 including an inductor structure according to certain aspects of the present disclosure.

FIG. 8 shows an example in which the inductor 710 shown in FIG. 7 is implemented with an inductor structure 810 according to aspects of the present disclosure. The inductor structure 810 has a first terminal 812 (also referred to as a first port) and a second terminal 814 (also referred to as a second port). In the example shown in FIG. 8, the first terminal 812 is coupled to the common port 216 and the second terminal 814 is coupled to the first port 212.

Figure 9:
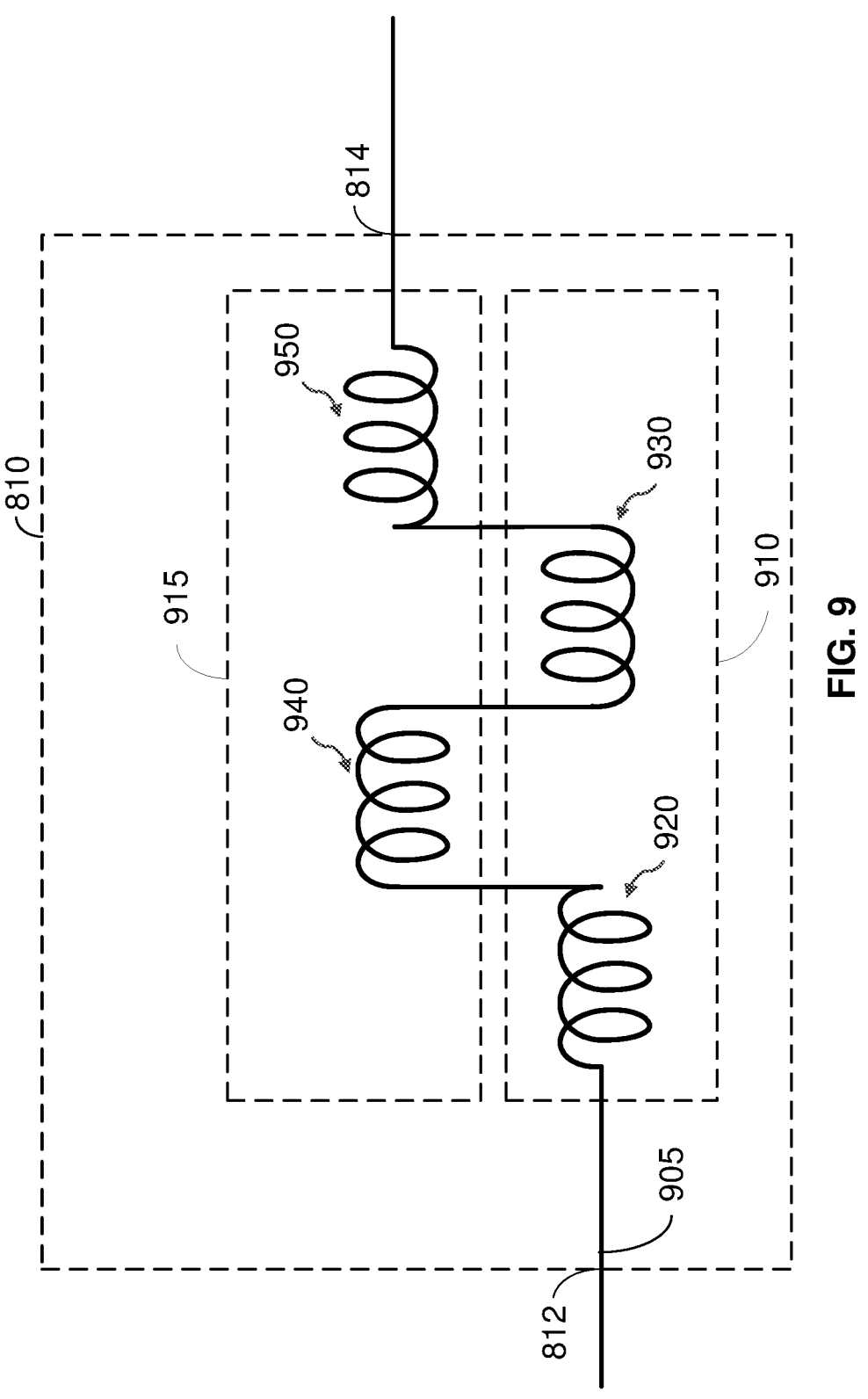
FIG. 9 shows an exemplary implementation of the inductor structure of FIG. 8 according to certain aspects of the present disclosure.

FIG. 9 shows a circuit schematic of an exemplary implementation of the inductor structure 810. In this example, the inductor structure 810 includes a conductor path 905 between the first terminal 812 and the second terminal 814.

The conductor path 905 includes a first dipole inductor 910 and a second dipole inductor 915. As used herein, a dipole inductor includes two inductors (e.g., spiral inductors or loop inductors) having opposite magnetic field polarities due to opposite current flows in the two inductors. For example, the current may flow in the clockwise direction in one of the two inductors and flow in the counterclockwise in the other one of the two inductors. In the example in FIG. 9, the conductor path 905 is contiguous from the first terminal 812 to the second terminal 814.

The first dipole inductor 910 includes a first inductor 920 and a second inductor 930, and the second dipole inductor 915 includes a third inductor 940 and a fourth inductor 950. In certain aspects, the first inductor 920 and the second inductor 930 are formed from a first metal layer, and the third inductor 940 and the fourth inductor 950 are formed from a second metal layer above the first metal layer. This allows the second dipole inductor 915 to be stacked on top of the first dipole inductor 910 for a more compact structure, as discussed further below.

In the example shown in FIG. 9, the first inductor 920 is coupled between the first terminal 812 and the third inductor 940, the third inductor 940 is coupled between the first inductor 920 and the second inductor 930, and the fourth inductor 950 is coupled between the second inductor 930 and the second terminal 814. As a result, the conductor path 905 alternates between the inductors 920 and 930 in the first dipole inductor 910 and the inductors 940 and 950 in the second dipole inductor 915. For example, when current flows from the first terminal 812 to the second terminal 814 through the conductor path 905, the current flows through the inductors 920, 930, 940, and 950 in the following order: the first inductor 920 in the first metal layer, the third inductor 940 in the second metal layer, the second inductor 930 in the first metal layer, and the fourth inductor 950 in the second metal layer.

Alternating between the inductors 920 and 930 in the first metal layer and the inductors 940 and 950 in the second metal layer reduces capacitive coupling between the inductors 920, 930, 940, and 950 in the inductor structure 810. The lower capacitive coupling allows the inductor structure 810 to achieve a higher self-resonant frequency. The higher self-resonant frequency increases the impedance of the first filter 220 seen by a signal in the second frequency band, which reduces insertion loss for signals in the second frequency band and helps isolate the first port 212 (FIGS. 2, 3, 4, 7, 8) from the signals in the second frequency band.

FIG. 10A shows a perspective view of an exemplary implementation of the inductors 920, 930, 940, and 950 in FIG. 9. In this example, each of the inductors 920, 930, 940, and 950 is implemented with a respective spiral inductor. It is to be appreciated that each spiral inductor may have a smaller number of turns or a greater number of turns than the example shown in FIG. 10A.

In this example, the first inductor 920 and the second inductor 930 are formed from the first metal layer (e.g., using a lithographic and etching process). The first metal layer may be on and/or embedded in a substrate (e.g., silicon substrate, laminate, a low temperature co-fired ceramic, bismaleimide triazine (BT). PCB, etc.). FIG. 10B shows a top view of the first inductor 920 and the second inductor 930. In some implementations, each of the first inductor 920 and the second inductor 930 is a planar inductor (e.g., a planar spiral inductor). As used herein, a planar inductor is an inductor formed from a flat metal layer (e.g., first metal layer). As shown in FIG. 10B, the first inductor 920 is adjacent to the second inductor 930 in the first metal layer.

In this example, the third inductor 940 and the fourth inductor 950 are formed from the second metal layer (e.g., using a lithographic and etching process), which is above the first metal layer. The second metal layer may be on and/or embedded in the substrate (e.g., silicon substrate, laminate, a low temperature co-fired ceramic, bismaleimide triazine (BT), PCB, etc.). FIG. 10C shows a top view of the third inductor 940 and the fourth inductor 950. In some implementations, each of the third inductor 940 and the fourth inductor 950 is a planar inductor (e.g., a planar spiral inductor). As shown in FIG. 10C, the third inductor 940 is adjacent to the fourth inductor 950 in the second metal layer.

Figure 12A:
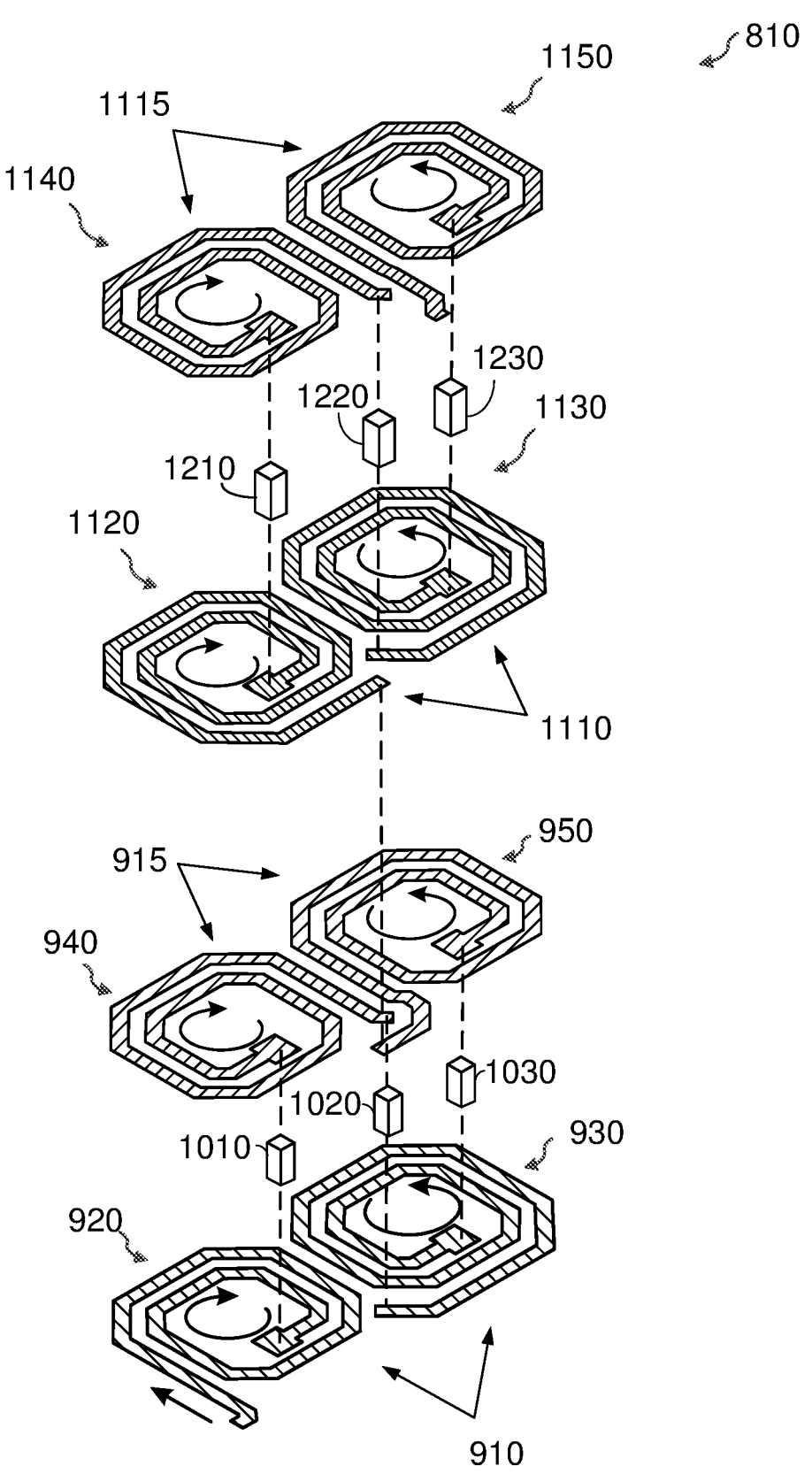
FIG. 12A shows a perspective view of an exemplary implementation of inductors in the inductor structure of FIG. 11 according to certain aspects of the present disclosure.

In this example, the conductor path 905 (FIG. 9) of the inductor structure 810 (FIG. 9) also includes a first via 1010, a second via 1020, and a third via 1030 as shown in FIGS. 10A and 12A. The first via 1010 is disposed between the first inductor 920 and the third inductor 940, and couples the first inductor 920 to the third inductor 940. The second via 1020 is disposed between the second inductor 930 and the third inductor 940, and couples the second inductor 930 to the third inductor 940. The third via 1030 is disposed between the second inductor 930 and the fourth inductor 950, and couples the second inductor 930 to the fourth inductor 950. Note that FIG. 10A shows an exploded view of the inductor structure 810 to more clearly show the vias 1010, 1020, and 1030.

In the example in FIG. 10A, the first inductor 920 and second inductor 930 of the first dipole inductor 910 overlap the third inductor 940 and the fourth inductor 950 of the second dipole inductor 915. This allows the second dipole inductor 915 to be stacked on top of the first dipole inductor 910 to achieve a given inductance in a smaller area of a chip or substrate.

In this example, the conductor path 905 (FIG. 9) is configured such that current flows in opposite directions in the first inductor 920 and the second inductor 940 of the first dipole inductor 910. FIG. 10A includes arrows showing the direction of current flow in the first inductor 920 and the direction of current flow in the second inductor 930 for the case where current flows in the conductor path 905 from the first terminal 812 (FIG. 9) to the second terminal 814 (FIG. 9). In this example, the current flows in the clockwise direction in the first inductor 920 and the counterclockwise direction in the second inductor 930. The opposite current flows cause the first inductor 920 and the second inductor 930 to have opposite magnetic field polarities, which results in strong magnetic coupling between the first inductor 920 and the second inductor 930.

The conductor path 905 (FIG. 9) is also configured such that current flows in opposite directions in the third inductor 940 and the fourth inductor 950 of the second dipole inductor 915. FIG. 10A includes arrows showing the direction of current flow in the third inductor 940 and the direction of current flow in the fourth inductor 950 for the case where current flows in the conductor path 905 from the first terminal 812 (FIG. 9) to the second terminal 814 (FIG. 9). In this example, the current flows in the clockwise direction in the third inductor 940 and the counterclockwise direction in the fourth inductor 950. The opposite current flows cause the third inductor 940 and the fourth inductor 950 to have opposite magnetic field polarities, which results in strong magnetic coupling between the third inductor 940 and the fourth inductor 950.

Thus, in this example, the inductor structure 810 includes a stack of dipole inductors including the first dipole inductor 910 and the second dipole inductor 915, in which the second dipole inductor 915 overlaps and is stacked on top of the first dipole inductor 910. The dipole inductors 910 and 915 concentrate the magnetic fields of the inductor structure 810 within the inductor structure 810. As a result, the magnetic fields quickly diminish outside of the inductor structure 810, which reduces harmonic and magnetic emissions from the inductor structure 810.

Figure 11:
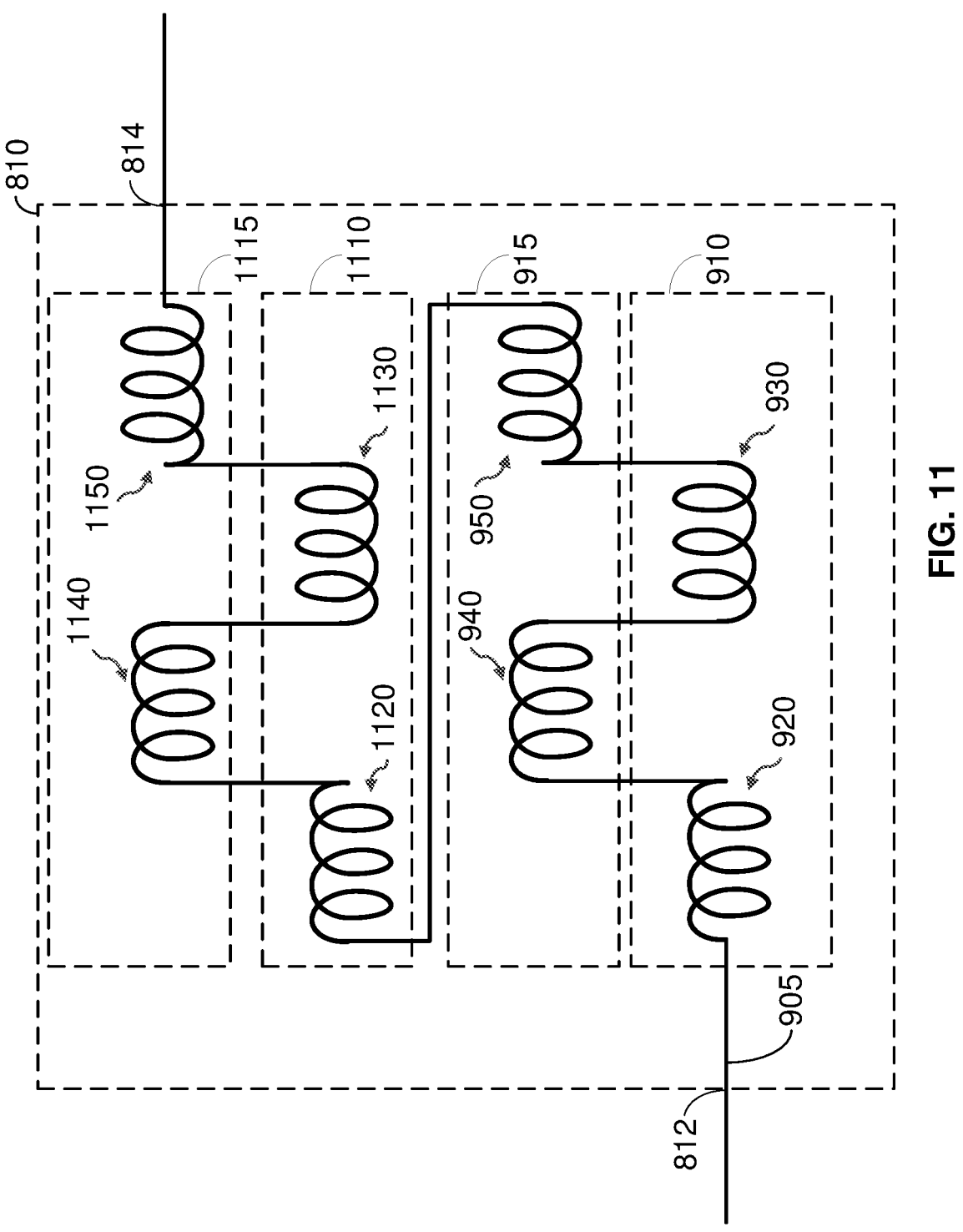
FIG. 11 shows another exemplary implementation of the inductor structure of FIG. 8 according to certain aspects of the present disclosure.

It is to be appreciated that additional dipole inductors may be stacked to increase inductance for a given area. In this regard, FIG. 11 shows an example in which the conductor path 905 of the inductor structure 810 includes a third dipole inductor 1110 and a fourth dipole inductor 1115. The third dipole inductor 1110 includes a fifth inductor 1120 and a sixth inductor 1130, and the fourth dipole inductor 1115 includes seventh inductor 1140 and an eighth inductor 1150. In certain aspects, the fifth inductor 1120 and the sixth inductor 1130 are formed from a third metal layer, and the seventh inductor 1140 and the eighth inductor 1150 are formed from a fourth metal layer above the third metal layer (e.g., using a lithographic and etching process). The third metal layer is above the second metal layer discussed above.

In this example, the fifth inductor 1120 is coupled between the fourth inductor 950 and the seventh inductor 1140, the seventh inductor 1140 is coupled between the fifth inductor 1120 and the sixth inductor 1130, the sixth inductor 1130 is coupled between the seventh inductor 1140 and the eighth inductor 1150, and the eighth inductor 1150 is coupled between the sixth inductor 1130 and the second terminal 814. As a result, the conductor path 905 alternates between the inductors 1120 and 1130 in the third dipole inductor 1110 and the inductors 1140 and 1150 in the fourth dipole inductor 1115. As discussed above, alternating between inductors in different metal layers reduces capacitive coupling between the three-dimensionally (3D) distributed magnetic dipole inductors, which allows the inductor structure 810 to achieve a higher self-resonant frequency. The higher self-resonant frequency increases the impedance of the first filter 220 (FIGS. 2, 3, 4, 7, 8) seen by a signal in the second frequency band, which reduces insertion loss for signals in the second frequency band and helps isolate the first port 212 (FIGS. 2, 3, 4, 7, 8) from the signals in the second frequency band (first referenced in connection with FIG. 2 and its associated text).

FIG. 12A shows a perspective view of an exemplary implementation of the inductors 1120, 1130, 1140, and 1150 in FIG. 11. In this example, each of the inductors 1120, 1130, 1140, and 1150 is implemented with a respective spiral inductor. It is to be appreciated that each spiral inductor may have a smaller number of turns or a greater number of turns than the example shown in FIG. 12A.

Figure 12B:
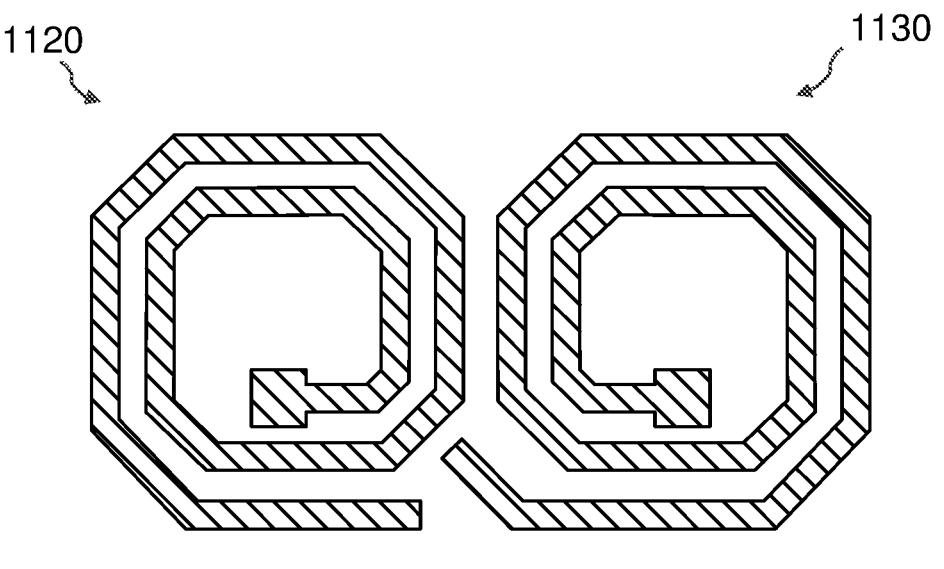
FIG. 12B shows a top view of two of the inductors shown in FIG. 12A according to certain aspects of the present disclosure.

In this example, the fifth inductor 1120 and the sixth inductor 1130 are formed from the third metal layer (e.g., using a lithographic and etching process). The third metal layer may be on and/or embedded in a substrate (e.g., silicon substrate, laminate, a low temperature co-fired ceramic, bismaleimide triazine (BT), PCB, etc.). As shown in FIG. 12A, the third metal layer is above the first and second metal layers. FIG. 12B shows a top view of the fifth inductor 1120 and the sixth inductor 1130. In some implementations, each of the fifth inductor 1120 and the sixth inductor 1130 is a planar inductor (e.g., a planar spiral inductor).

Figure 12C:
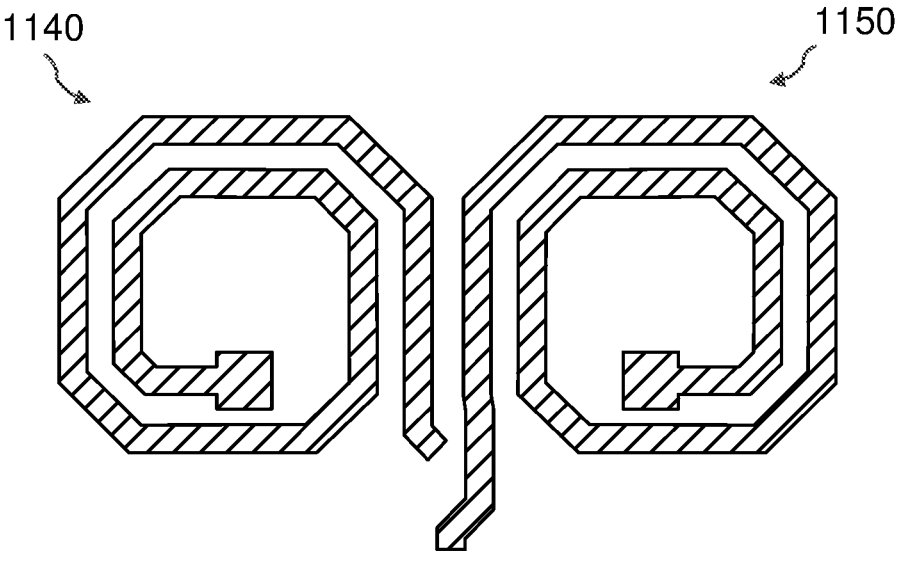
FIG. 12C shows a top view of another two of the inductors shown in FIG. 12A according to certain aspects of the present disclosure.

In this example, the seventh inductor 1140 and the eighth inductor 1150 are formed from the fourth metal layer (e.g., using a lithographic and etching process), which is above the third metal layer. The fourth metal layer may be on and/or embedded in the substrate (e.g., silicon substrate, laminate, a low temperature co-fired ceramic, bismaleimide triazine (BT), PCB, etc.). FIG. 12C shows a top view of the seventh inductor 1140 and the eighth inductor 1150. In some implementations, each of the seventh inductor 1140 and the eighth inductor 1150 is a planar inductor (e.g., a planar spiral inductor).

In this example, the fourth inductor 950 is coupled to the fifth inductor 1120. In FIG. 12A, the coupling between the fourth inductor 950 and the fifth inductor 1120 is represented by a vertical dashed line. For example, the fourth inductor 950 may be coupled to the fifth inductor 1120 by a via (not shown). Also, in this example, the conductor path (FIG. 11) 905 of the inductor structure 810 also includes a fourth via 1210, a fifth via 1220, and a sixth via 1230. The fourth via 1210 is disposed between the fifth inductor 1120 and the seventh inductor 1140, and couples the fifth inductor 1120 to seventh inductor 1140. The fifth via 1220 is disposed between the sixth inductor 1130 and the seventh inductor 1140, and couples the sixth inductor 1130 to the seventh inductor 1140. The sixth via 1230 is disposed between the sixth inductor 1130 and the eighth inductor 1150, and couples the sixth inductor 1130 to the eighth inductor 1150.

In this example, the conductor path 905 is configured such that current flows in opposite directions in the fifth inductor 1120 and the sixth inductor 1130 of the third dipole inductor 1110. FIG. 12A includes arrows showing the direction of current flow in the fifth inductor 1120 and the direction of current flow in the sixth inductor 1130 for the case where current flows in the conductor path 905 from the first terminal 812 to the second terminal 814 as shown in FIG. 11. In this example, the current flows in the clockwise direction in the fifth inductor 1120 and the counterclockwise direction in the sixth inductor 1130. The opposite current flows cause the fifth inductor 1120 and the sixth inductor 1130 to have opposite magnetic field polarities.

The conductor path 905 is also configured such that current flows in opposite directions in the seventh inductor 1140 and the eighth inductor 1150 of the fourth dipole inductor 1115. FIG. 12A includes arrows showing the direction of current flow in the seventh inductor 1140 and the direction of current flow in the eighth inductor 1150 for the case where current flows in the conductor path 905 from the first terminal 812 to the second terminal 814. In this example, the current flows in the clockwise direction in the seventh inductor 1140 and the counterclockwise direction in the eighth inductor 1150. The opposite current flows cause the seventh inductor 1140 and the eighth inductor 1150 to have opposite magnetic field polarities.

Thus, in this example, the inductor structure 810 includes a stack of four dipole inductors including the first dipole inductor 910, the second dipole inductor 915, the third dipole inductor 1110, and the fourth dipole inductor 1115.

Figure 13:
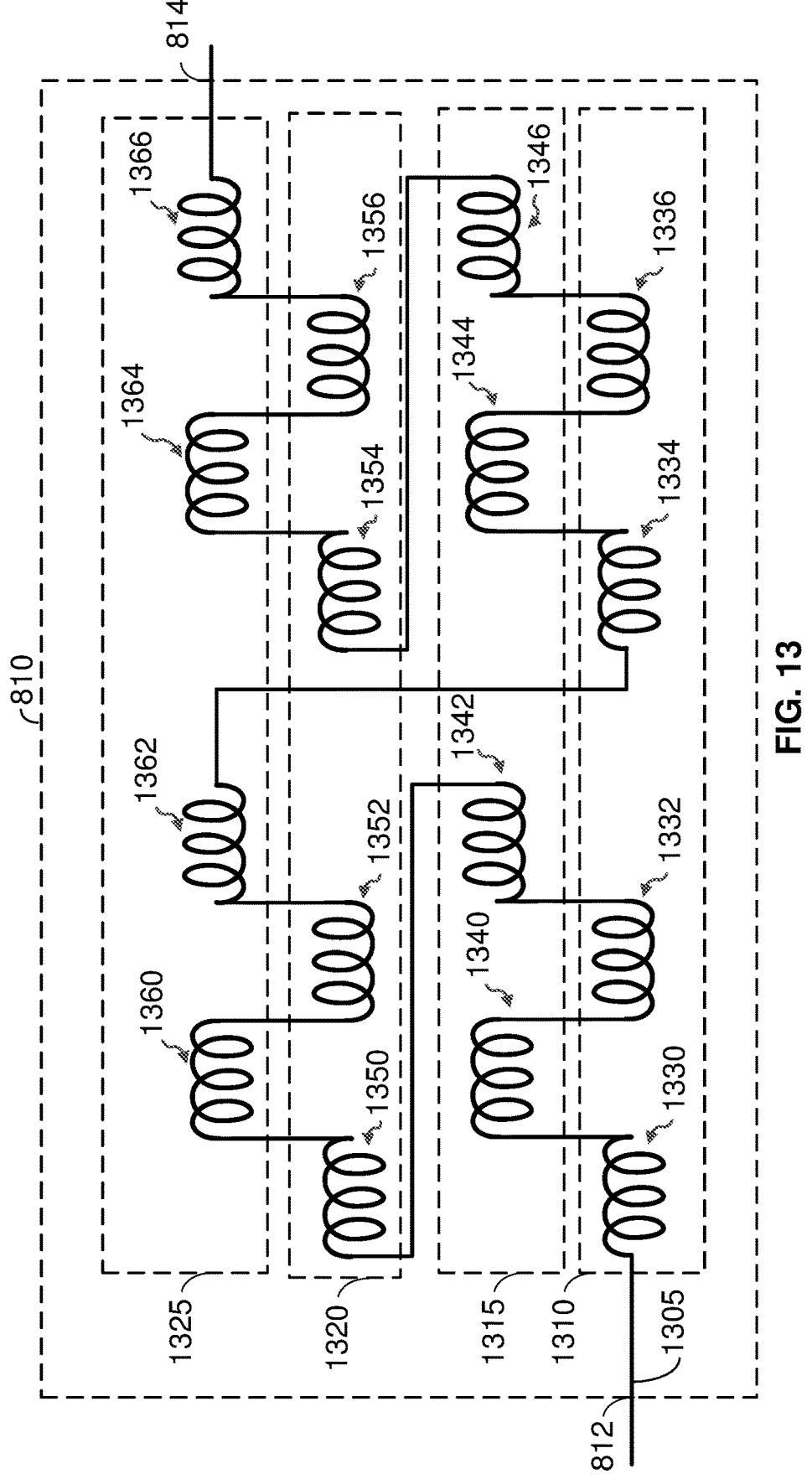
FIG. 13 shows another exemplary implementation of the inductor structure of FIG. 8 according to certain aspects of the present disclosure.

It is to be appreciated that the inductor structure 810 may include more than two inductors in each metal layer. In this regard, FIG. 13 shows an exemplary implementation in which the inductor structure 810 includes four inductors in each metal layer. In this example, the four inductors in each metal layer form a quadrupole inductor. As used herein, a quadrupole inductor includes four inductors in which current flows in the clockwise direction in two of the four inductors and current flows in the counterclockwise direction in the other two of the four inductors. In this example, the inductor structure 810 includes a stack of quadrupole inductors (e.g., a stack of four quadrupole inductors). As discussed further below, the quadrupole inductors in the inductor structure 810 enhance the concentration of magnetic fields within the inductor structure 810, which reduces emissions from the inductor structure 810.

In the example in FIG. 13, the inductor structure 810 includes a conductor path 1305 between the first terminal 812 and the second terminal 814. The conductor path 1305 includes a first quadrupole inductor 1310, a second quadrupole inductor 1315, a third quadrupole inductor 1320, and a fourth quadrupole inductor 1325. The first quadrupole inductor includes a first inductor 1330, a second inductor 1332, a third inductor 1334, and a fourth inductor 1336. The second quadrupole inductor 1315 includes a fifth inductor 1340, a sixth inductor 1342, a seventh inductor 1344, and an eighth inductor 1346. The third quadrupole inductor 1320 includes a ninth inductor 1350, a tenth inductor 1352, an eleventh inductor 1354, and a twelfth inductor 1356. The fourth quadrupole inductor 1325 includes a thirteenth inductor 1360, a fourteenth inductor 1362, a fifteenth inductor 1364, and a sixteenth inductor 1366. In the example in FIG. 13, the conductor path 1305 is contiguous from the first terminal 812 to the second terminal 814.

In certain aspects, the inductors 1330, 1332, 1334, and 1336 of the first quadrupole inductor 1310 are formed from a first metal layer, and the inductors 1340, 1342, 1344, and 1346 of the second quadrupole inductor 1315 are formed from a second metal layer above the first metal layer (e.g., using a lithographic and etching process). The inductors 1350, 1352, 1354, and 1356 of the third quadrupole inductor 1320 are formed from a third metal layer above the second metal layer, and the inductors 1360, 1362, 1364, and 1366 of the fourth quadrupole inductor 1325 are formed from a fourth metal layer above the third metal layer (e.g., using a lithographic and etching process).

In the example shown in FIG. 13, the first inductor 1330 is coupled between the first terminal 812 and the fifth inductor 1340, the fifth inductor 1340 is coupled between the first inductor 1330 and the second inductor 1332, and the second inductor 1332 is coupled between the fifth inductor 1340 and the sixth inductor 1342. The sixth inductor 1342 is coupled between the second inductor 1332 and the ninth inductor 1350, the ninth inductor 1350 is coupled between the sixth inductor 1342 and the thirteenth inductor 1360, the thirteenth inductor 1360 is coupled between the ninth inductor 1350 and the tenth inductor 1352, and the tenth inductor 1352 is coupled between the thirteenth inductor 1360 and the fourteenth inductor 1362. The fourteenth inductor 1362 is coupled between tenth inductor 1352 and the third inductor 1334, the third inductor 1334 is coupled between the fourteenth inductor 1362 and the seventh inductor 1344, the seventh inductor 1344 is coupled between the third inductor 1334 and the fourth inductor 1336, and the fourth inductor 1336 is coupled between the seventh inductor 1344 and the eighth inductor 1346. The eighth inductor 1346 is coupled between the fourth inductor 1336 and the eleventh inductor 1354, the eleventh inductor 1354 is coupled between the eighth inductor 1346 and the fifteenth inductor 1364, the fifteenth inductor 1364 is coupled between the eleventh inductor 1354 and the twelfth inductor 1356, the twelfth inductor 1356 is coupled between the fifteenth inductor 1364 and the sixteenth inductor 1366, and the sixteenth inductor 1366 is coupled between the twelfth inductor 1356 and the second terminal 814.

As shown in FIG. 13, the conductor path 1305 alternates between inductors in different layers, which reduces capacitive coupling between the inductors in the inductor structure 810. The lower capacitive coupling allows the inductor structure 810 to achieve much higher self-resonant frequency. The self-resonance frequency of the inductive structure 810 is due to the fact that the inductor structure 810 is not purely inductive and has capacitance due to, for example, the capacitance coupling between the inductors in the inductor structure 810. In this example, the lower capacitive coupling increases the self-resonant frequency. The higher self-resonant frequency may be in the second frequency band (first referenced in connection with FIG. 2 and its associated text) or higher frequency to increase the impedance of the first filter 220 seen by a signal in the second frequency band. The high impedance in the second frequency band reduces insertion loss for signals in the second frequency band and helps isolate the first port 212 of the first filter 220 from the signals in the second frequency band.

Figure 14A:
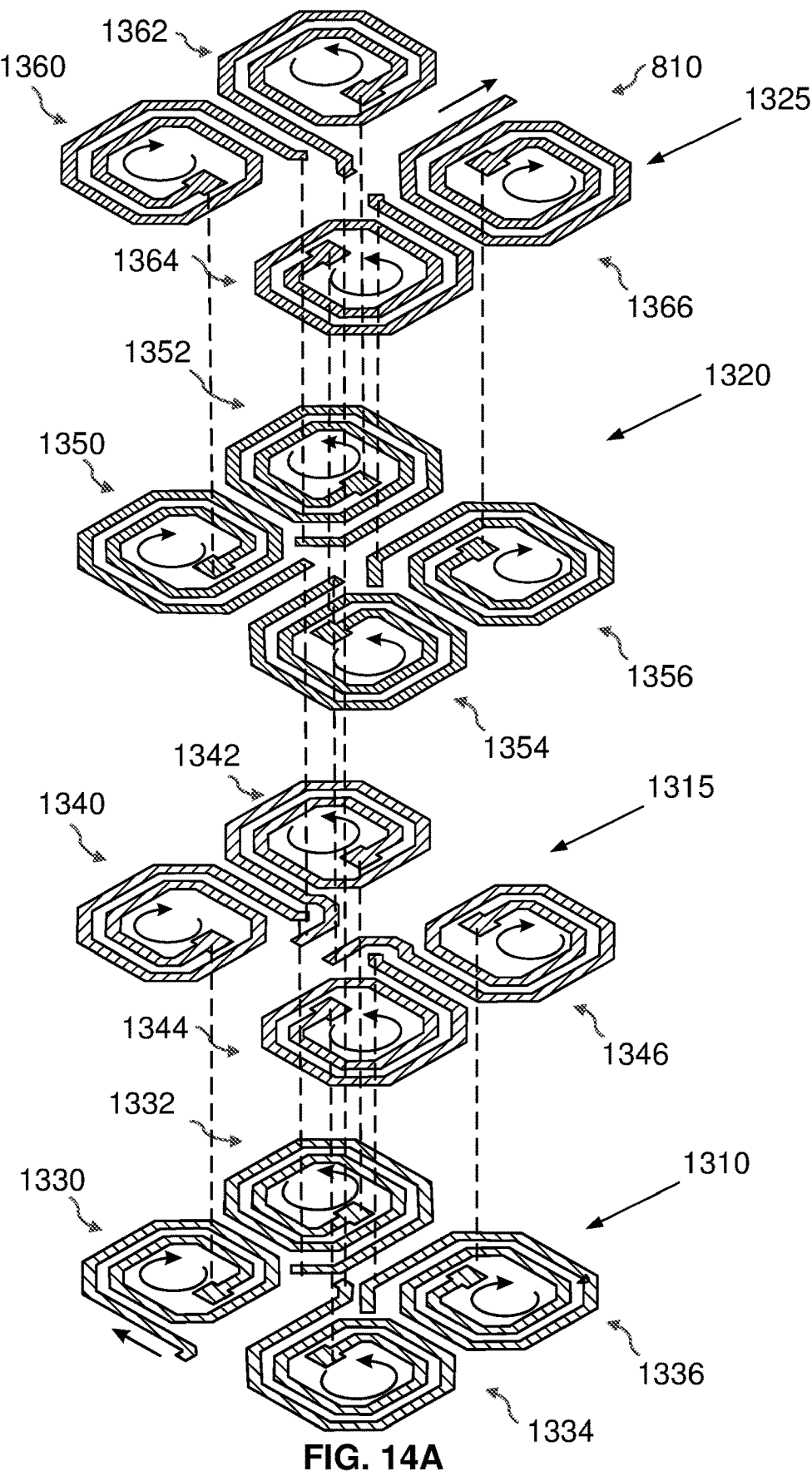
FIG. 14A shows a perspective view of an exemplary implementation of inductors in the inductor structure of FIG. 13 according to certain aspects of the present disclosure.

FIG. 14A shows a perspective view of an exemplary implementation of the inductors 1330, 1332, 1334, 1336, 1340, 1342, 1344, 1346, 1350, 1352, 1354, 1356, 1360, 1362, 1364, and 1366. In this example, each of the inductors 1330, 1332, 1334, 1336, 1340, 1342, 1344, 1346, 1350, 1352, 1354, 1356, 1360, 1362, 1364, and 1366 is implemented with a respective spiral inductor. It is to be appreciated that each spiral inductor may have a smaller number of turns or a greater number of turns than the example shown in FIG. 14A. In FIG. 14A, the coupling between the inductors 1330, 1332, 1334, 1336, 1340, 1342, 1344, 1346, 1350, 1352, 1354, 1356, 1360, 1362, 1364, and 1366 are represented by vertical dashed lines. The inductors 1330, 1332, 1334, 1336, 1340, 1342, 1344, 1346, 1350, 1352, 1354, 1356, 1360, 1362, 1364, and 1366 may be coupled using vias between the metal layers. For case of illustration, the vias are not explicitly shown in FIG. 14A. In this example, the conductor path of the inductor structure 810 includes the inductors 1330, 1332, 1334, 1336, 1340, 1342, 1344, 1346, 1350, 1352, 1354, 1356, 1360, 1362, 1364, and 1366 and the vias coupling the inductors 1330, 1332, 1334, 1336, 1340, 1342, 1344, 1346, 1350, 1352, 1354, 1356, 1360, 1362, 1364, and 1366.

In this example, the inductors 1330, 1332, 1334, and 1336 of the first quadrupole inductor 1310 are configured such that, when a current flows from the first terminal 812 to the second terminal 814 as shown in FIG. 13, the current flows in a first direction (e.g., clockwise direction) in the first inductor 1330 and the fourth inductor 1336, and the current flows in a second direction (e.g., counterclockwise direction) in the second inductor 1332 and the third inductor 1334, where the first direction and the second direction are opposite. In this regard, FIG. 14A includes arrows showing the direction of current flow in each of the inductors 1330, 1332, 1334, and 1336 for the case where a current flows in the conductor path 1305 from the first terminal 812 to the second terminal 814 of the inductor structure 810. As shown in FIG. 14A, the current flows in the clockwise direction in the first inductor 1330 and the fourth inductor 1336, and the current flows in the counterclockwise direction in the second inductor 1332 and the third inductor 1334 in this example. In this example, the different current flows cause the first inductor 1330 and the second inductor 1332 to have opposite magnetic field polarities, and the third inductor 1334 and the fourth inductor 1336 to have opposite magnetic field polarities. In addition, the first inductor 1330 and the third inductor 1334 may have opposite magnetic field polarities, and second inductor 1332 and the fourth inductor 1336 may have opposite magnetic field polarities due to opposite current flows. The opposite magnetic field polarities result in strong magnetic coupling between the inductors 1330, 1332, 1334, and 1336, which concentrates the magnetic fields of the first quadrupole inductor 1310 within the first quadrupole inductor 1310 for reduced emissions outside the inductor structure

Figure 14B:
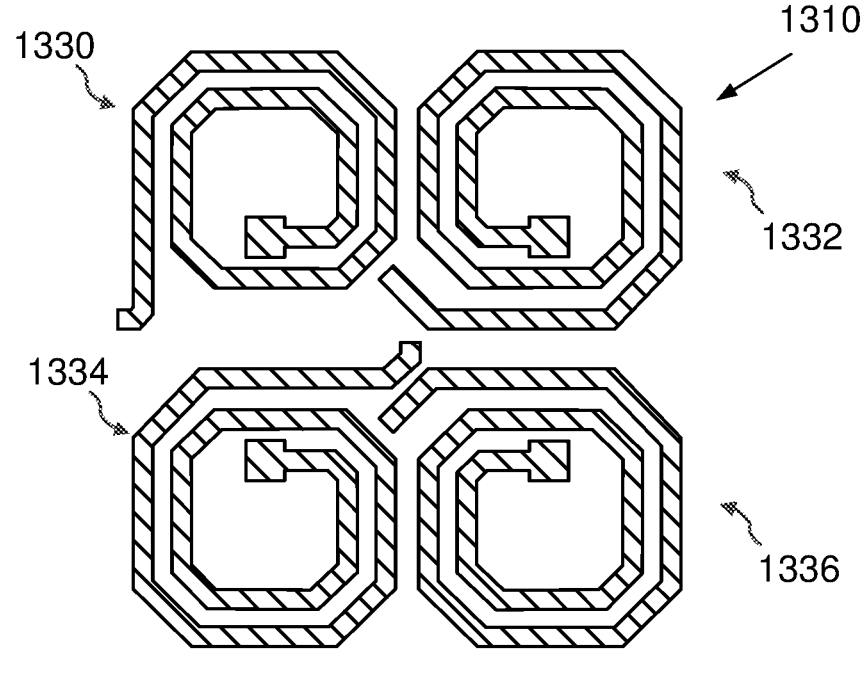
FIG. 14B shows a top view of four of the inductors shown in FIG. 14A according to certain aspects of the present disclosure.

810. FIG. 14B shows a top view of the inductors 1330, 1332, 1334, and 1336 in the first metal layer.

Figure 14C:
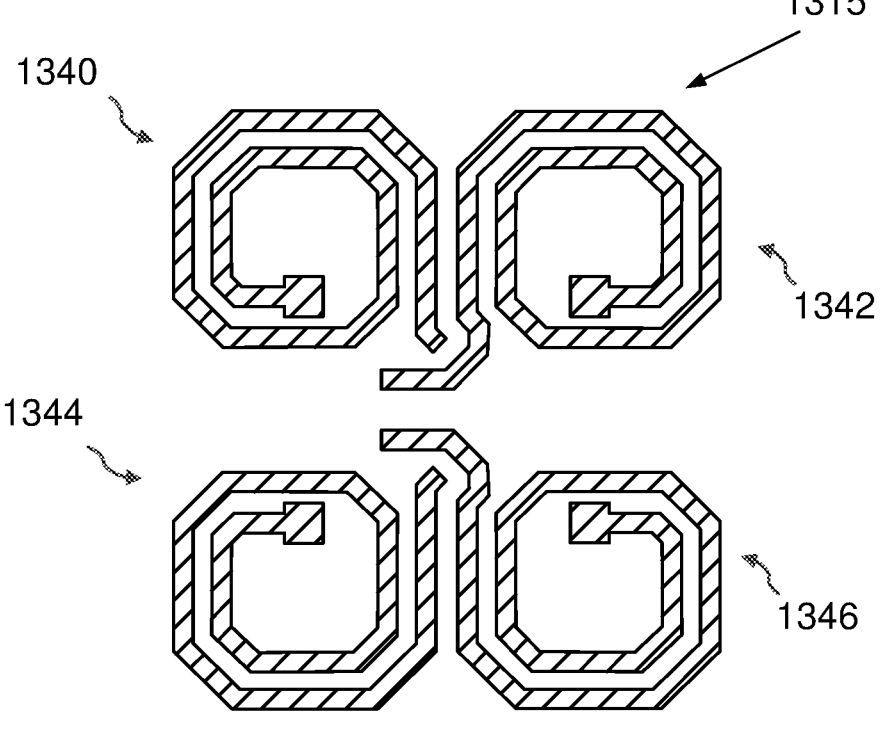
FIG. 14C shows a top view of another four of the inductors shown in FIG. 14A according to certain aspects of the present disclosure.

In this example, the inductors 1340, 1342, 1344, and 1346 of the second quadrupole inductor 1315 are configured such that, when a current flows from the first terminal 812 to the second terminal 814, the current flows in the first direction (e.g., clockwise direction) in the fifth inductor 1340 and the eighth inductor 1346, and the current flows in a second direction (e.g., counterclockwise direction) in the sixth inductor 1342 and the seventh inductor 1344. In this regard, FIG. 14A includes arrows showing the direction of current flow in each of the inductors 1340, 1342, 1344, and 1346 for the case where current flows in the conductor path 1305 from the first terminal 812 to the second terminal 814 of the inductor structure 810. As shown in FIG. 14A, the current flows in the clockwise direction in the fifth inductor 1340 and the eighth inductor 1346, and the current flows in the counterclockwise direction in the sixth inductor 1342 and the seventh inductor 1344 in this example. In this example, the different current flows cause the fifth inductor 1340 and the sixth inductor 1342 to have opposite magnetic field polarities, and the seventh inductor 1344 and the eighth inductor 1346 to have opposite magnetic field polarities. In addition, the fifth inductor 1340 and the seventh inductor 1344 may have opposite magnetic field polarities, and sixth inductor 1342 and the eighth inductor 1346 may have opposite magnetic field polarities due to opposite current flows. The opposite magnetic field polarities result in strong magnetic coupling between the inductors 1340, 1342, 1344, and 1346, which concentrates the magnetic fields of the second quadrupole inductor 1315 within the second quadrupole inductor 1315 for reduced emissions outside the inductor structure 810. FIG. 14C shows a top view of the inductors 1340, 1342, 1344, and 1346 in the second metal layer.

Figures 14D, 14E:
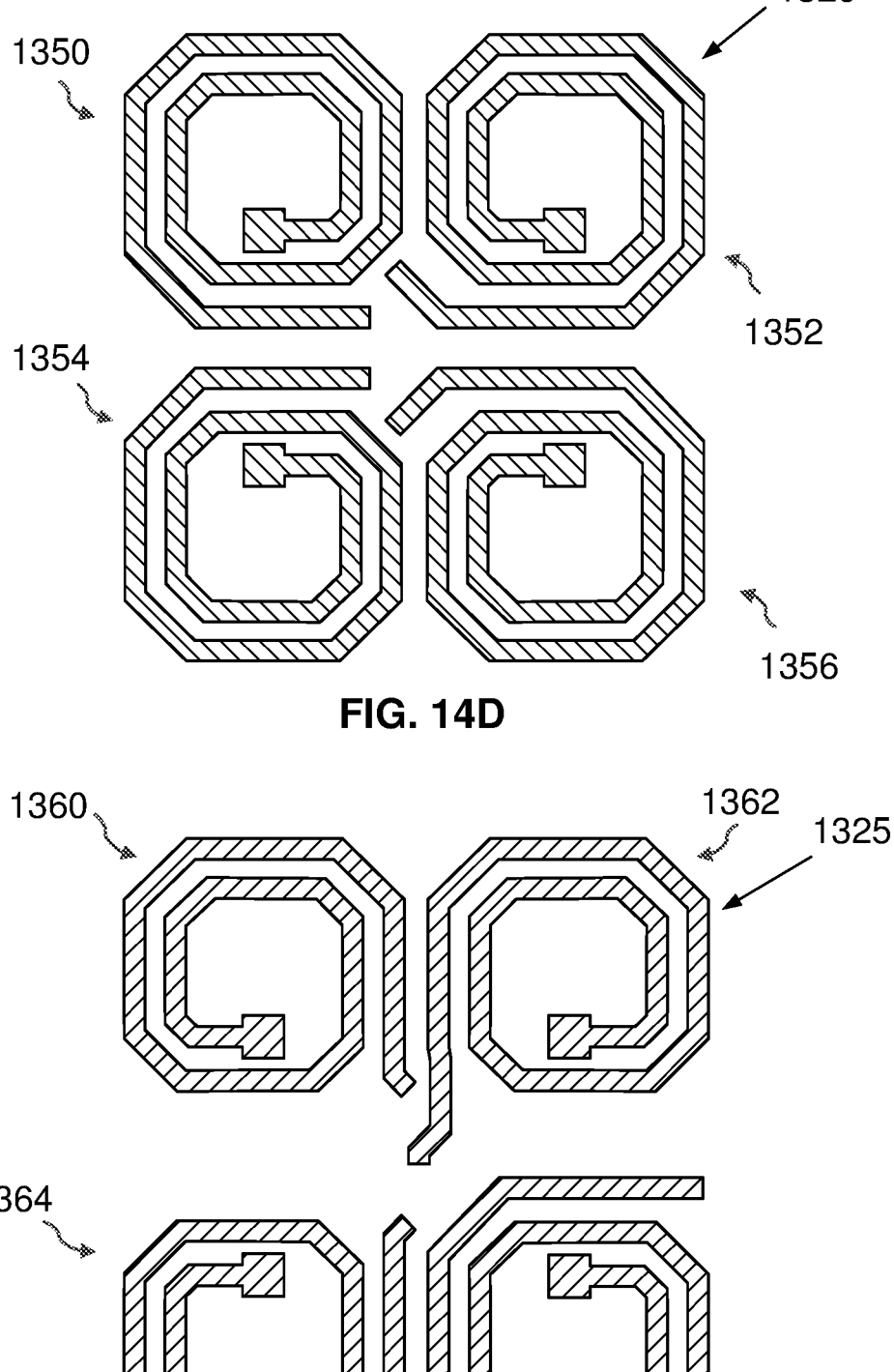
FIG. 14D shows a top view of yet another four of the inductors shown in FIG. 14A according to certain aspects of the present disclosure.
FIG. 14E shows a top view of still another four of the inductors shown in FIG. 14A according to certain aspects of the present disclosure.

In this example, the inductors 1350, 1352, 1354, and 1356 of the third quadrupole inductor 1320 are configured such that, when a current flows from the first terminal 812 to the second terminal 814, the current flows in the first direction (e.g., clockwise direction) in the ninth inductor 1350 and the twelfth inductor 1356, and the current flows in the second direction (e.g., counterclockwise direction) in the tenth inductor 1352 and the eleventh inductor 1354. In this regard, FIG. 14A includes arrows showing the direction of current flow in each of the inductors 1350, 1352, 1354, and 1356 for the case where current flows in the conductor path 1305 from the first terminal 812 to the second terminal 814 of the inductor structure 810. As shown in FIG. 14A, the current flows in the clockwise direction in the ninth inductor 1350 and the twelfth inductor 1356, and the current flows in the counterclockwise direction in the tenth inductor 1352 and the eleventh inductor 1354 in this example. In this example, the different current flows cause the ninth inductor 1350 and the tenth inductor 1352 to have opposite magnetic field polarities, and the eleventh inductor 1354 and the twelfth inductor 1356 to have opposite magnetic field polarities. In addition, the ninth inductor 1350 and the eleventh inductor 1354 may have opposite magnetic field polarities, and tenth inductor 1352 and the twelfth inductor 1356 may have opposite magnetic field polarities due to opposite current flows. The opposite magnetic field polarities result in strong magnetic coupling between the inductors 1350, 1352, 1354, and 1356, which concentrates the magnetic fields of the third quadrupole inductor 1320 within the third quadrupole inductor 1320 for reduced emissions outside the inductor structure 810. FIG. 14D shows a top view of the inductors 1350, 1352, 1354, and 1356 in the third metal layer.

In this example, the inductors 1360, 1362, 1364, and 1366 of the fourth quadrupole inductor 1325 are configured such that, when a current flows from the first terminal 812 to the second terminal 814, the current flows in the first direction (e.g., clockwise direction) in the thirteenth inductor 1360 and the sixteenth inductor 1366, and the current flows in the second direction (e.g., counterclockwise direction) in the fourteenth inductor 1362 and the fifteenth inductor 1364, where the first direction and the second direction are opposite. In this regard, FIG. 14A includes arrows showing the direction of current flow in each of the inductors 1360, 1362, 1364, and 1366 for the case where current flows in the conductor path 1305 from the first terminal 812 to the second terminal 814 of the inductor structure 810. As shown in FIG. 14A, the current flows in the clockwise direction in the thirteenth inductor 1360 and the sixteenth inductor 1366, and the current flows in the counterclockwise direction in the fourteenth inductor 1362 and the fifteenth inductor 1364 in this example. In this example, the different current flows cause the thirteenth inductor 1360 and the fourteenth inductor 1362 to have opposite magnetic field polarities, and the fifteenth inductor 1364 and the sixteenth inductor 1366 to have opposite magnetic field polarities. In addition, the thirteenth inductor 1360 and the fifteenth inductor 1364 may have opposite magnetic field polarities, and fourteenth inductor 1362 and the sixteenth inductor 1366 may have opposite magnetic field polarities due to opposite current flows. The opposite magnetic field polarities result in strong magnetic coupling between the inductors 1360, 1362, 1364, and 1366, which concentrates the magnetic fields of the fourth quadrupole inductor 1325 within the fourth quadrupole inductor 1325 for reduced emissions outside the inductor structure 810. FIG. 14E shows a top view of the inductors 1360, 1362, 1364, and 1366 in the fourth metal layer.

Although the inductor structure 810 includes a stack of four quadrupole inductors in the example shown in FIG. 14A, it is to be appreciated that the inductor structure 810 may include less than or more than four quadrupole inductors in some implementations. For example, in some implementations, the third quadrupole inductor 1320 and the fourth quadrupole inductor 1325 may be omitted. In this example, the third inductor 1334 may be coupled between the sixth inductor 1342 and the seventh inductor 1344, and the eighth inductor 1346 may be coupled between the fourth inductor 1336 and the second terminal 814. In this example, the inductor structure 810 includes two stacked quadrupole inductors including the first quadrupole inductor 1310 and the second quadrupole inductor 1315.

Figure 15:
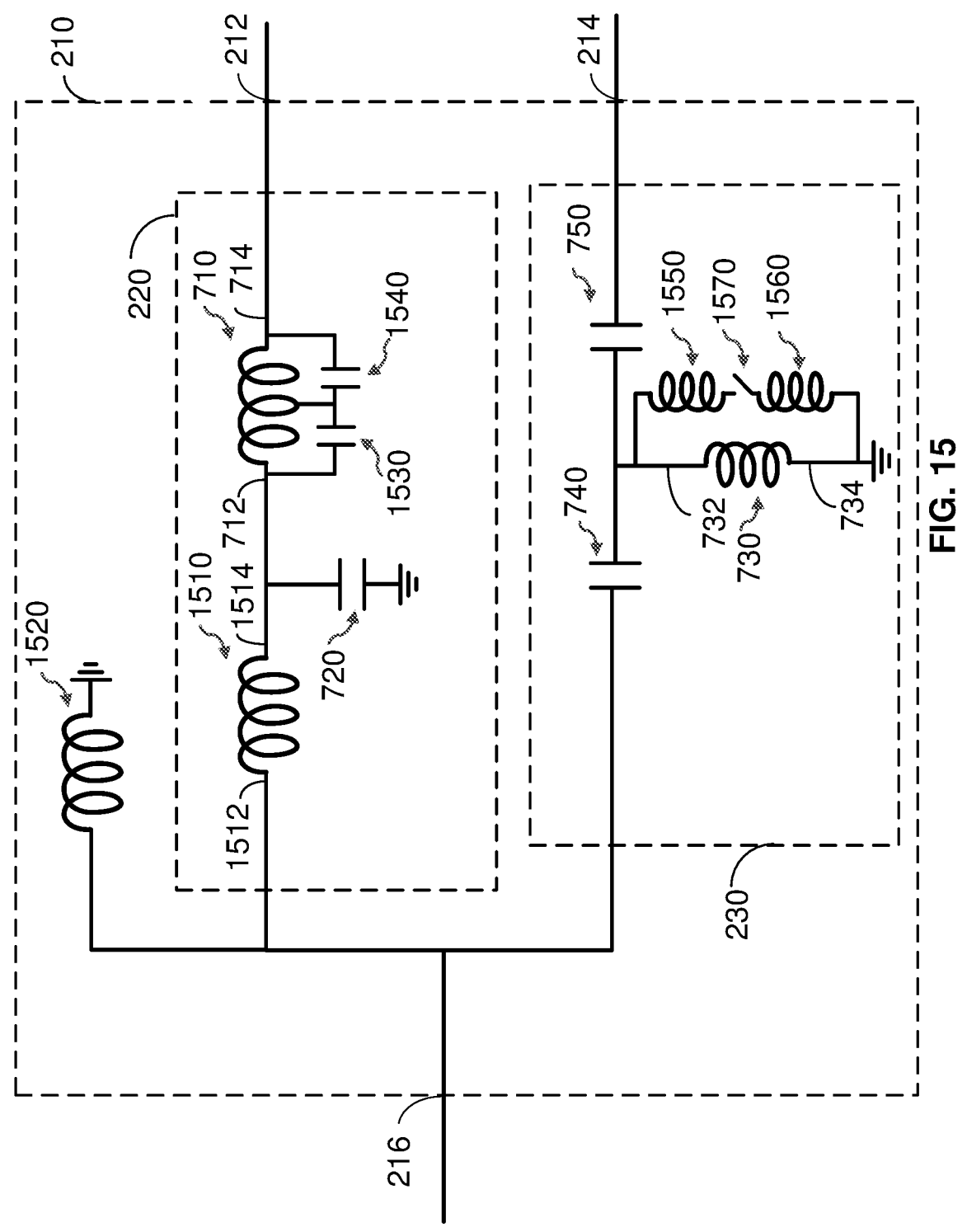
FIG. 15 shows another exemplary implementation of a first filter and a second filter in the frequency multiplexer of FIG. 2 according to certain aspects of the present disclosure.

FIG. 15 shows an example in which the first filter 220 (FIGS. 2, 3, 4, 7, 8, 15) further includes a first capacitor 1530 and a second capacitor 1540 coupled to the inductor 710. The first capacitor 1530 is coupled in parallel with a first portion of the inductor 710, and the second capacitor 1540 is coupled in parallel with a second portion of the inductor 710. The first capacitor 1530 and the second capacitor 1540 may be used, for example, to tune the self-resonance frequency of the inductor 710 to provide high impedance in the second frequency band, and therefore high isolation from signals in the second frequency band. In certain aspects, the capacitance of the first capacitor 1530 and the capacitance of the second capacitor 1540 may be different by a relatively small amount to provide two closely spaced impedance peaks, which provides high impedance (and therefore high isolation) over a wider frequency range compared with a single capacitor. However, it is to be appreciated that one of the capacitors 1530 and 1540 may be omitted in some implementations. Each of the capacitors 1530 and 1540 may be implemented with a metal-insulator-metal (MIM) capacitor, a metal-oxide-semiconductor (MOS) capacitor, or another type of capacitor.

Figure 16:
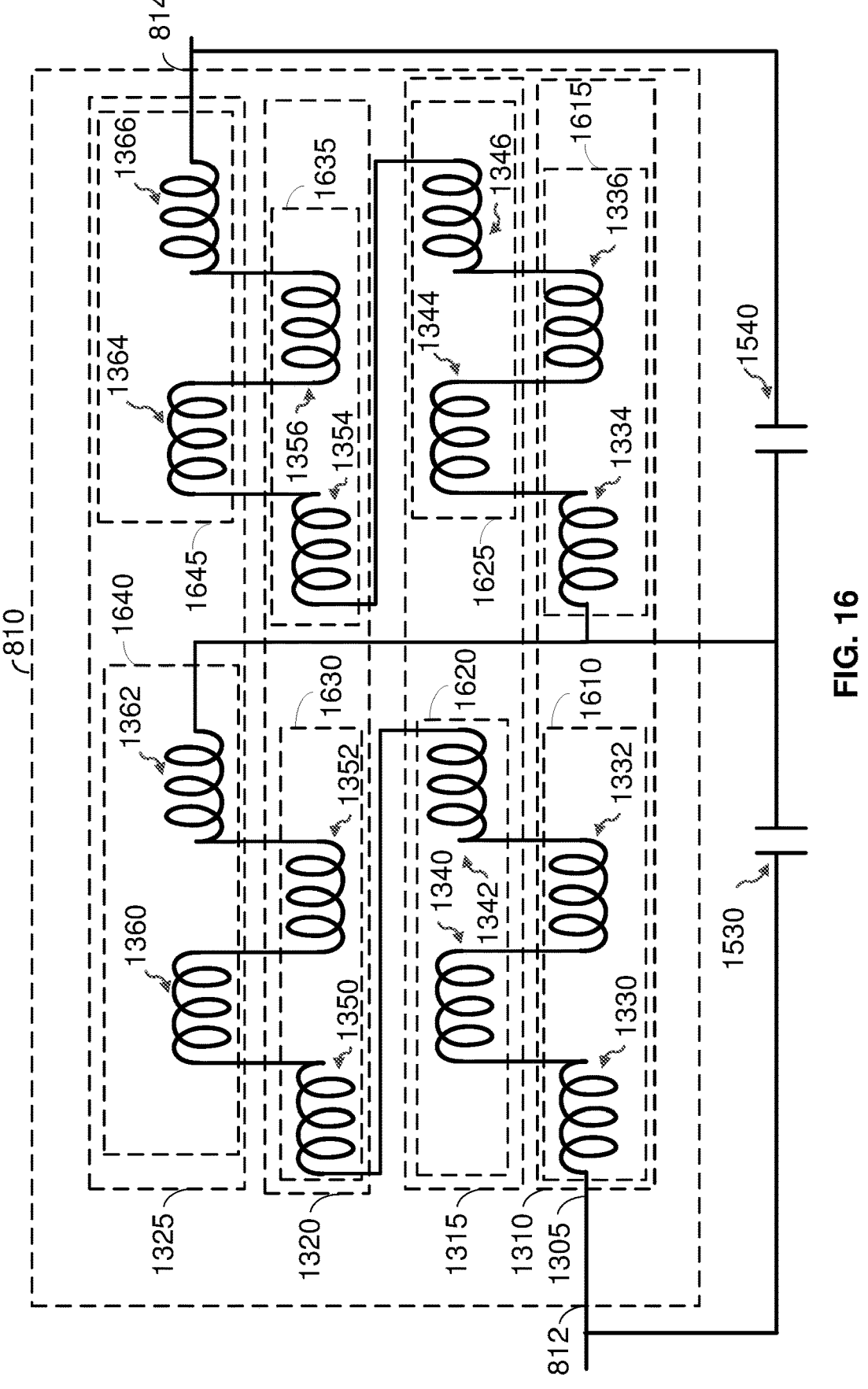
FIG. 16 shows an example of a first capacitor and a second capacitor coupled to an inductor structure according to certain aspects of the present disclosure.

FIG. 16 shows an example in which the inductor 710 (FIG. 15) is implemented with the exemplary inductor structure 810. In this example, the first terminal 812 of the inductor structure 810 corresponds to the first terminal 712 (FIG. 15) of the inductor 710, and the second terminal 814 of the inductor structure 810 corresponds to the second terminal 714 (FIG. 15) of the inductor 710. In this example, a first terminal of the first capacitor 1530 (FIG. 15) is coupled to the first terminal 812 and a second terminal of the first capacitor 1530 is coupled between the inductors 1362 and 1334. Also, a first terminal of the second capacitor 1540 is coupled between the inductors 1362 and 1334, and a second terminal of the second capacitor 1540 is coupled to the second terminal 814. For an implementation that is not illustrated in FIG. 16, where the third quadrupole inductor 1320 and the fourth quadrupole inductor 1325 are omitted from the inductor structure 810 of FIG. 16, the second terminal of the first capacitor 1530 (FIG. 15) may be coupled between the inductors 1342 and 1334, and the first terminal of the second capacitor 1540 (FIG. 15) may be coupled between the inductors 1342 and 1334.

In the example shown in FIG. 16, the first quadrupole inductor 1310 includes a first dipole inductor 1610 and a second dipole inductor 1615, in which the first dipole inductor 1610 includes the inductors 1330 and 1332, and the second dipole inductor 1615 includes the inductors 1334 and 1336. The second quadrupole inductor 1315 includes a third dipole inductor 1620 and a fourth dipole inductor 1625, in which the third dipole inductor 1620 includes the inductors 1340 and 1342, and the fourth dipole inductor 1625 includes the inductors 1344 and 1346. The third quadrupole inductor 1320 includes a fifth dipole inductor 1630 and a sixth dipole inductor 1635, in which the fifth dipole inductor 1630 includes the inductors 1350 and 1352, and the sixth dipole inductor 1635 includes the inductors 1354 and 1356. The fourth quadrupole inductor 1325 includes a seventh dipole inductor 1640 and an eighth dipole inductor 1645, in which the seventh dipole inductor 1640 includes the inductors 1360 and 1362, and the eighth dipole inductor 1645 includes the inductors 1364 and 1366.

In the example shown in FIG. 16, the first capacitor 1530 is coupled in parallel with a first portion of the inductor structure 810 including the dipole inductors 1610, 1620, 1630, and 1640, and the second capacitor 1540 is coupled in parallel with a second portion of the inductor structure 810 including the dipole inductors 1615, 1625, 1635, and 1645. In this example, the dipole inductors 1610 and 1615 are in the first metal layer and form the first quadrupole inductor 1310, the dipole inductors 1620 and 1625 are in the second metal layer and form the second quadrupole inductor 1315, the dipole inductors 1630 and 1635 are in the third metal layer and form the third quadrupole inductor 1320, and the dipole inductors 1640 and 1645 are in the fourth metal layer and form the fourth quadrupole inductor 1325. In certain aspects, the dipole inductors 1610, 1620, 1630, and 1640 overlap one another, and the dipole inductors 1615, 1625, 1635, and 1645 overlap one another (e.g., as shown in the example in FIG. 14A). For implementations where the third quadrupole inductor 1320 and the fourth quadrupole inductor 1325 are omitted, the first portion of the inductor structure 810 includes the dipole inductors 1610 and 1620, and the second portion of the inductor structure 810 includes dipole inductors 1615 and 1625.

Returning to FIG. 15, in the example shown in FIG. 15, the first filter 220 (FIGS. 2, 3, 4, 7, 8, 15) also includes a second inductor 1510 according to certain aspects. In the discussion below, the inductor 710 is referred to as the first inductor 710 to distinguish from the second inductor 1510.

In this example, a first terminal 1512 of the second inductor 1510 is coupled to the common port 216 of the frequency multiplexer 210, and a second terminal 1514 of the second inductor 1510 is coupled to the first terminal 712 of the first inductor 710. In this example, a first terminal of the capacitor 720 is coupled between the first inductor 710 and the second inductor 1510, and a second terminal of the capacitor 720 is coupled to ground (or some reference potential). In this example, the inductors 710 and 1510 and the capacitor 720 form a T-network low pass filter. However, it is to be appreciated that the present disclosure is not limited to this example.

In this example, the frequency multiplexer 210 also includes a shunt inductor 1520 coupled between the common port 216 and ground (or some reference potential). The shunt inductor 1520 may be used to provide the frequency multiplexer 210 with electrostatic discharge (ESD) protection by shunting ESD current from the common port 216 to ground.

Figure 17:
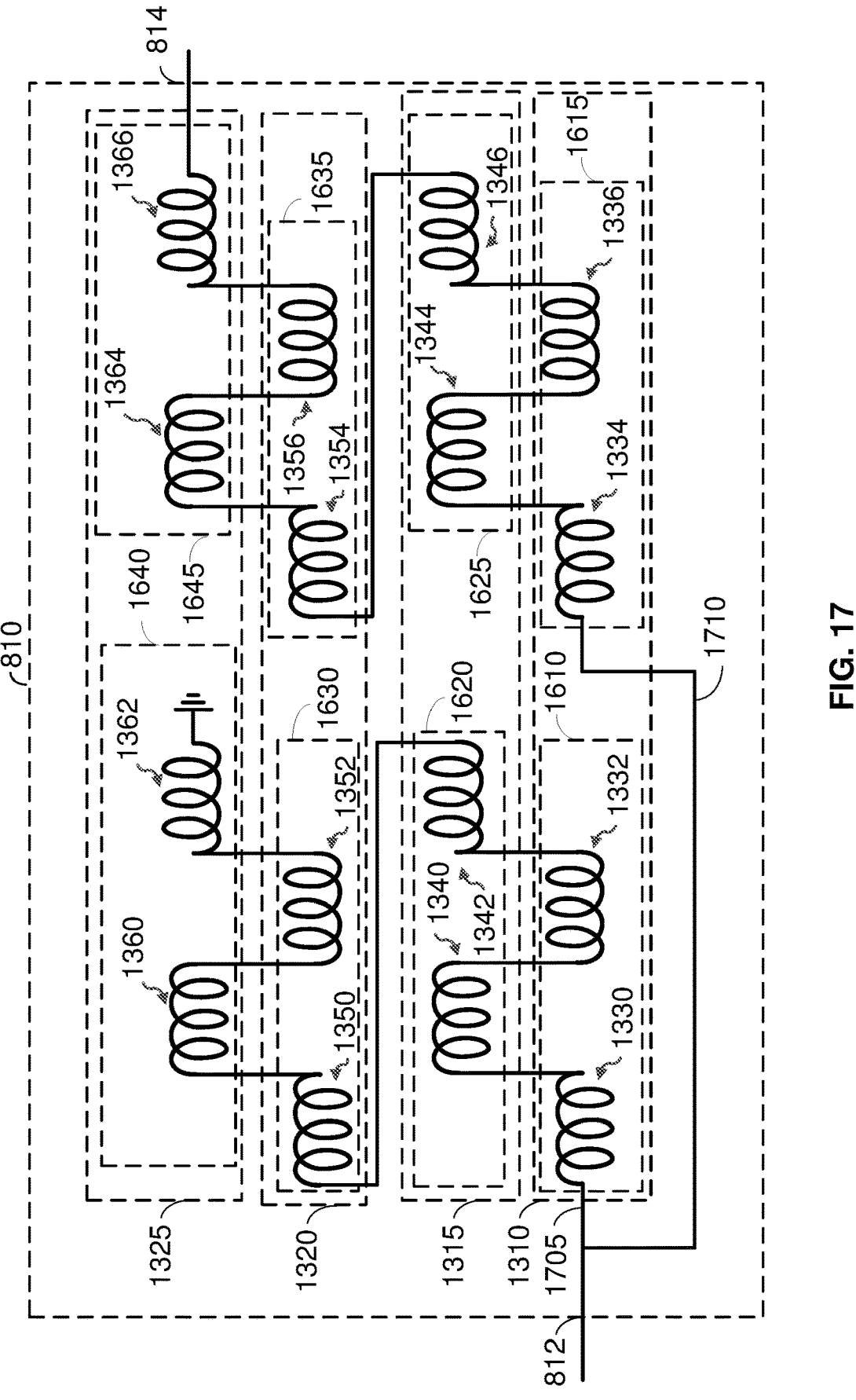
FIG. 17 shows an example of an inductor structure including a shunt inductor and an inductor of a filter according to certain aspects of the present disclosure.

FIG. 17 shows an example in which the second inductor 1510 and the shunt inductor 1520 as shown in FIG. 15 are implemented with the exemplary inductor structure 810. In this example, the first inductor 710 may be implemented with a first instance of the inductor structure 810 and the second inductor 1510 and the shunt inductor 1520 may be implemented with a second instance of the inductor structure 810.

In the example in FIG. 17, the shunt inductor 1520 (FIG. 15) is implemented with a first portion of the inductor structure 810. The first portion includes a first conductor path 1705 between the first terminal 812 and ground (or some reference potential). In this example, the first conductor path 1705 includes the dipole inductors 1610, 1620, 1630, 1640 discussed above. In some implementations, the dipole inductors 1630 and 1640 may be omitted. In the example in FIG. 17, the first conductor path 1705 is contiguous from the first terminal 812 to ground.

In the example in FIG. 17, the second inductor 1510 (FIG. 15) is implemented with a second portion of the inductor structure 810. The second portion includes a second conductor path 1710 between the first terminal 812 and the second terminal 814. In this example, the second conductor path 1710 includes the dipole inductors 1615, 1625, 1635, 1645 discussed above. In some implementations, the dipole inductors 1635 and 1645 may be omitted. In the example in FIG. 17, the second conductor path 1710 is contiguous from the first terminal 812 to the second terminal 814.

Returning to FIG. 15, in the example shown in FIG. 15, the second filter 230 also includes a second inductor 1550, a third inductor 1560, and a switch 1570 according to certain aspects. In the discussion below, the inductor 730 is referred to as the first inductor 730 to distinguish from the second inductor 1550 and the third inductor 1560.

In this example, the second inductor 1550, the third inductor 1560, and the switch 1570 are coupled in series between the first terminal 732 and the second terminal 734 of the first inductor 730. In this example, the switch 1570 may be used to tune the corner frequency of the second filter 230 by controlling the on/off state of the switch 1570. In the example shown in FIG. 15, the second filter 230 has a larger inductance when the switch 1570 is turned off, which corresponds to a lower corner frequency. The second filter

230 has a smaller inductance when the switch 1570 is turned on, which corresponds to a higher corner frequency. Thus, in this example, the second filter 230 may be switched to the higher corner frequency by turning on the switch 1570 (e.g., for signal in higher frequency bands), and switched to the lower corner frequency by turning off the switch 1570.

Figure 18:
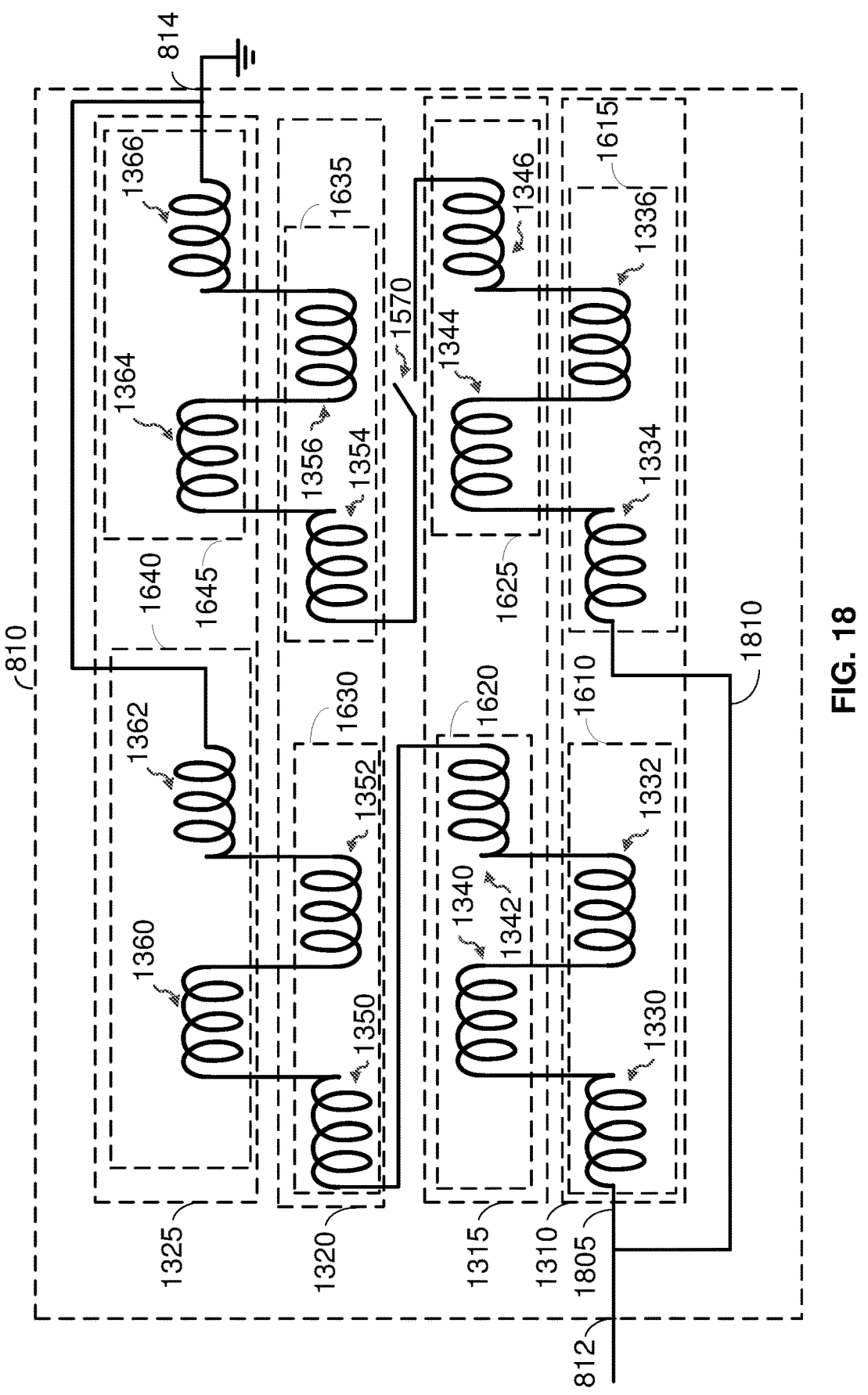
FIG. 18 shows an example of an inductor structure including inductors of a filter according to certain aspects of the present disclosure.

FIG. 18 shows an example in which the first inductor 730 (FIG. 15), the second inductor 1550 (FIG. 15), and the third inductor 1560 (FIG. 15) are implemented with the exemplary inductor structure 810. In the example in FIG. 18, the first inductor 730 is implemented with a first portion of the inductor structure 810. The first portion includes a first conductor path 1805 between the first terminal 812 and the second terminal 814 (which, in FIG. 18, is tied to ground (or some reference potential)). In this example, the first conductor path 1805 includes the dipole inductors 1610, 1620, 1630, 1640 discussed above. In some implementations, the dipole inductors 1630 and 1640 may be omitted.

In the example in FIG. 18, the second inductor 1550 (FIG. 15) and the third inductor 1560 (FIG. 15) are implemented with a second portion of the inductor structure 810. The second portion includes a second conductor path 1810 between the first terminal 812 and the second terminal 814 (which, in FIG. 18, is tied to ground (or some reference potential)). In this example, the second conductor path 1810 includes the dipole inductors 1615, 1625, 1635, 1645 discussed above. In the example in FIG. 18, the second inductor 1550 may include the dipole inductors 1615 and 1625, and the third inductor 1560 may include the dipole inductors 1635 and 1645, in which the switch 1570 is coupled between the dipole inductors 1625 and 1635.

Figure 19:
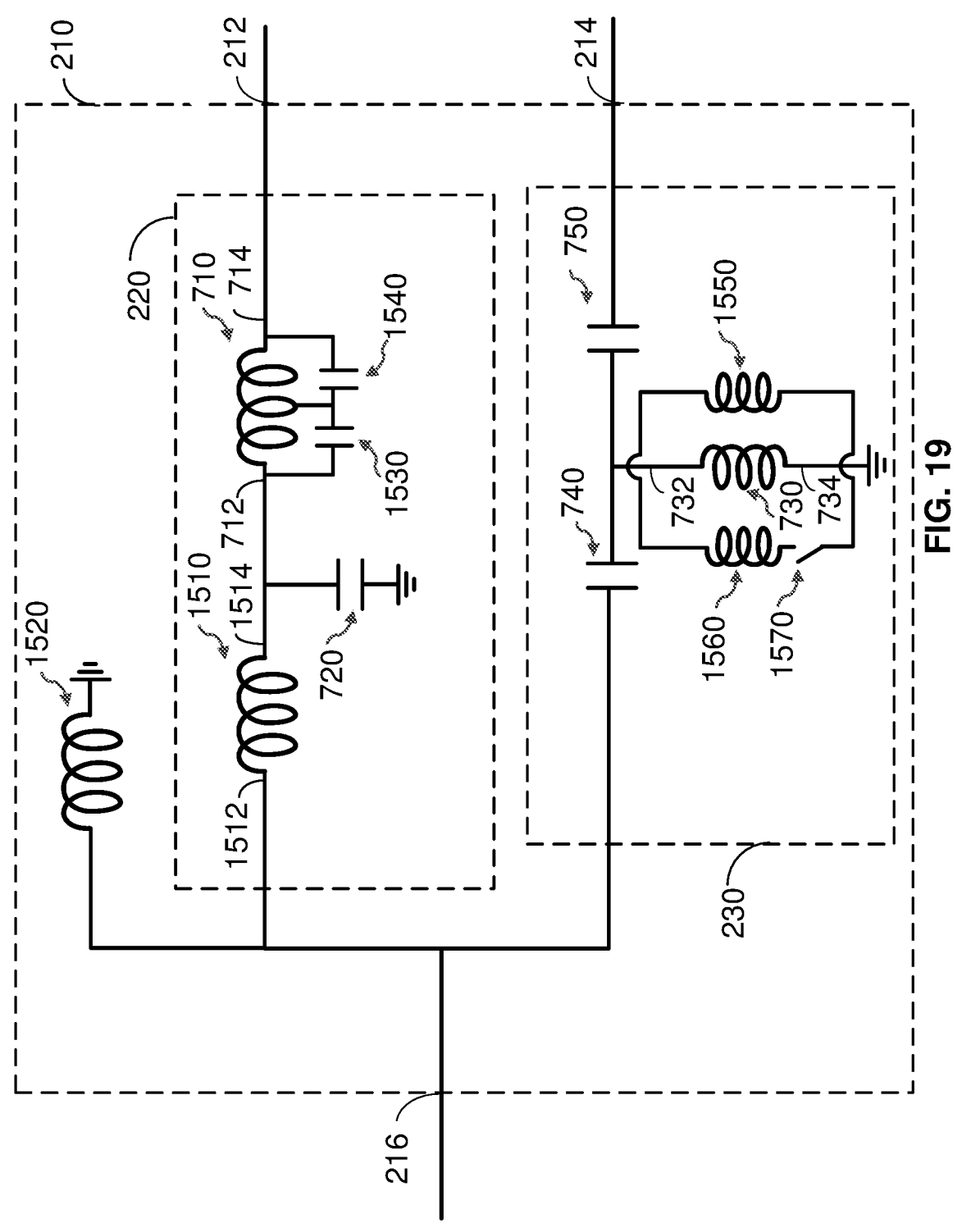
FIG. 19 shows yet another exemplary implementation of a first filter and a second filter in the frequency multiplexer of FIG. 2 according to certain aspects of the present disclosure.

FIG. 19 shows an example in which the second inductor 1550 (FIG. 19), the third inductor 1560 (FIG. 19), and the switch 1570 (FIG. 19) are coupled in a loop. In this example, the second inductor 1550 and the third inductor 1560 are magnetically (i.e., inductively) coupled with the first inductor 730 when the switch 1570 is turned on.

The magnetic coupling when the switch 1570 is turned on increases the inductance of the second filter 230 which lowers the corner frequency of the second filter 230. Thus, in this example, the second filter 230 may be switched to the higher corner frequency by turning off the switch 1570 (e.g., for signal in higher frequency bands), and switched to the lower corner frequency by turning on the switch 1570.

Figure 20:
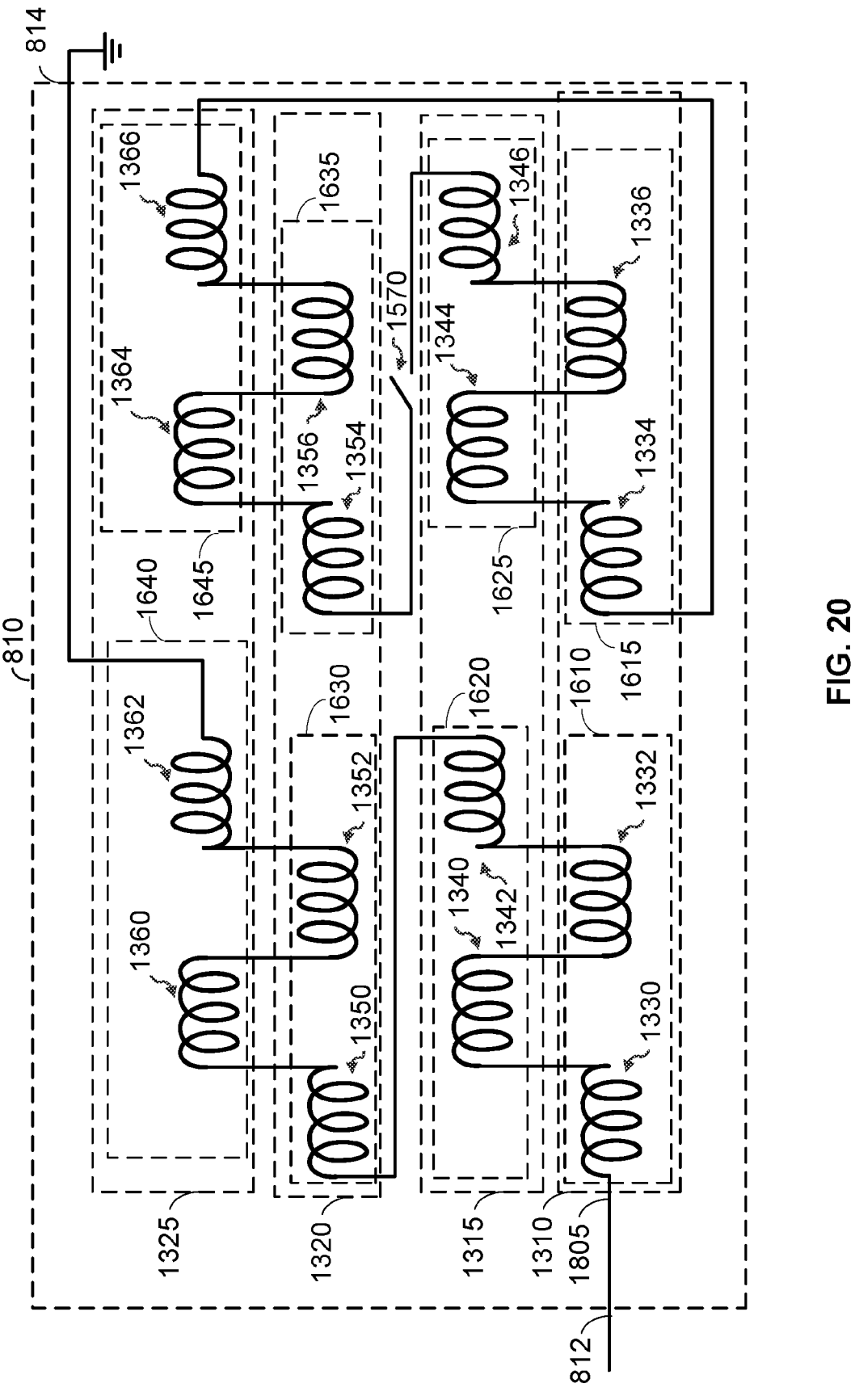
FIG. 20 shows another example of an inductor structure including inductors of a filter according to certain aspects of the present disclosure.

FIG. 20 shows an example in which the first inductor 730 (FIG. 15), the second inductor 1550 (FIG. 15), and the third inductor 1560 (FIG. 15) are implemented with the exemplary inductor structure 810. In the example in FIG. 20, the first inductor 730 is implemented with a first portion of the inductor structure 810, as discussed above with reference to FIG. 18. In the example of FIG. 20, as in the example of FIG. 18, the first inductor 730 is implemented with a first portion of the inductor structure 810. The first portion includes a first conductor path 1805 between the first terminal 812 and the second terminal 814 (which in FIG. 20 is tied to ground (or some reference potential)). In this example, the first conductor path 1805 includes the dipole inductors 1610, 1620, 1630, 1640 discussed above. In some implementations, the dipole inductors 1630 and 1640 may be omitted.

In the example in FIG. 20, the dipole inductors 1615, 1625, 1635, 1645 and the switch 1570 are coupled in a loop with the switch 1570 coupled between the dipole inductors 1625 and 1635. In the example in FIG. 20, the second inductor 1550 may include the dipole inductors 1615 and 1625, and the third inductor 1560 (FIG. 19) may include the dipole inductors 1635 and 1645.

It is to be appreciated that an inductor may be physically implemented on a chip with multiple inductors coupled in series and/or parallel.

It is to be appreciated that the present disclosure is not limited to the exemplary terminology used above to describe aspects of the present disclosure. For example, it is to be appreciated that magnetic coupling may also be referred to as inductive coupling or another term. Also, a port may also be referred to as a terminal or another term. Also, each of the inductors 710, 1510, 730, 1550, and 1560 may also be referred to as a filter inductor.

Figure 21:
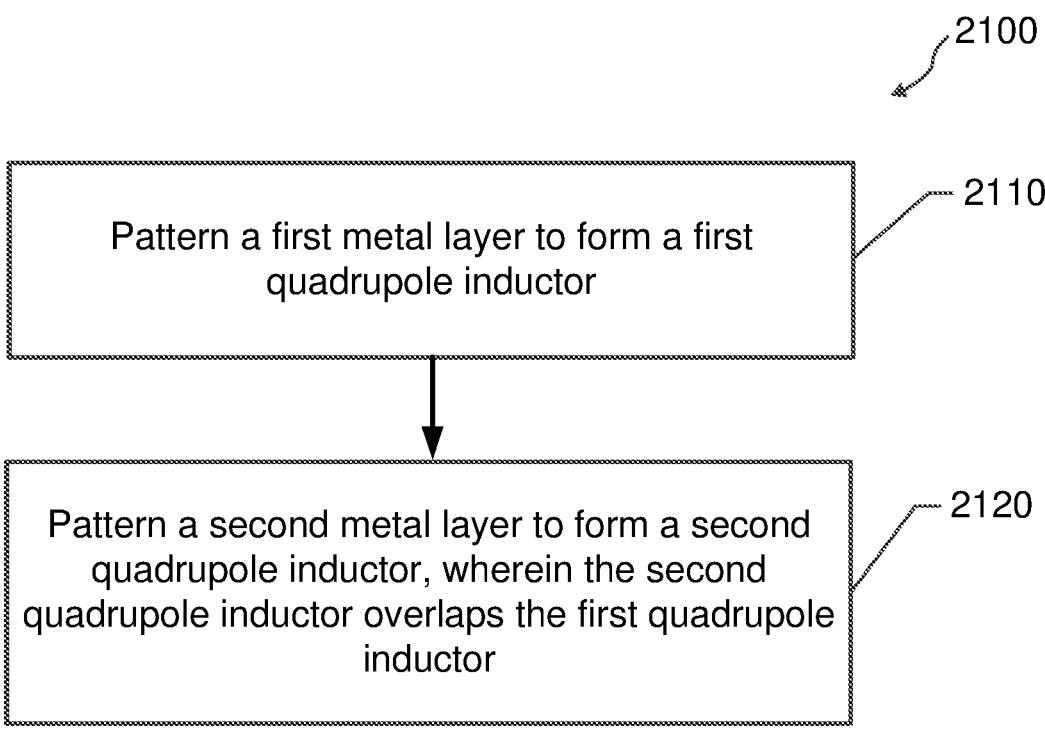
FIG. 21 is a flowchart illustrating a method of fabricating an inductor structure according to certain aspects of the present disclosure.

FIG. 21 is a flowchart illustrating a method 2100 of fabricating an inductor structure according to certain aspects. The inductor structure may correspond to the inductor structure 810 (FIGS. 8, 9, 10A, 11, 12A, 13, 14A, 16, 17, 18, 20).

At block 2110, a first metal layer is patterned to form a first quadrupole inductor. For example, the first metal layer may be patterned to form the first quadrupole inductor (e.g., first quadrupole inductor 1310 of FIGS. 13, 14A, 14B, 16, 17, 18, 20) using a lithographic and etching process.

At block 2120, a second metal layer is patterned to form a second quadrupole inductor. For example, the second metal layer may be patterned to form the second quadrupole inductor (e.g., second quadrupole inductor 1315 of FIGS. 13, 14A, 14C, 16, 17, 18, 20) using a lithographic and etching process.

The first metal layer may be above or below the second metal layer. In some implementations, the first metal layer and the second metal layer may be embedded in a substrate (e.g., a laminate, a PCB, etc.). In some implementations, the first metal layer and the second metal layer may be deposited on a semiconductor substrate with an insulating layer between the first metal layer and the second metal layer.

Implementation examples are described in the following numbered clauses:

1. An apparatus, comprising:
   an inductor structure, wherein the inductor structure includes:
   a first quadrupole inductor; and
   a second quadrupole inductor, wherein the second quadrupole inductor overlaps the first quadrupole inductor.
2. The apparatus of clause 1, wherein:
   the first quadrupole inductor is formed from a first metal layer; and
   the second quadrupole inductor is formed from a second metal layer above the first metal layer.
3. The apparatus of clause 1, wherein the inductor structure further comprises:
   a third quadrupole inductor, wherein the third quadrupole inductor overlaps the second quadrupole inductor.
4. The apparatus of clause 3, wherein:
   the first quadrupole inductor is formed from a first metal layer;
   the second quadrupole inductor is formed from a second metal layer above the first metal layer; and
   the third quadrupole inductor is formed from a third metal layer above the second metal layer.
5. The apparatus of clause 3, wherein the inductor structure further comprises:
   a fourth quadrupole inductor, wherein the fourth quadrupole inductor overlaps the third quadrupole inductor.

6. The apparatus of clause 5, wherein:
   the first quadrupole inductor is formed from a first metal layer;
   the second quadrupole inductor is formed from a second metal layer above the first metal layer;
   the third quadrupole inductor is formed from a third metal layer above the second metal layer; and
   the fourth quadrupole inductor is formed from a fourth metal layer above the third metal layer.
7. The apparatus of any one of clauses 1 to 6, wherein:
   the first quadrupole inductor comprises a first inductor, a second inductor, a third inductor, and a fourth inductor;
   the second quadrupole inductor comprises a fifth inductor, a sixth inductor, a seventh inductor, and an eighth inductor;
   the fifth inductor is coupled between the first inductor and the second inductor; and
   the second inductor is coupled between the fifth inductor and the sixth inductor.
8. The apparatus of clause 7, wherein:
   the seventh inductor is coupled between the third inductor and the fourth inductor; and
   the fourth inductor is coupled between the seventh inductor and the eighth inductor.
9. The apparatus of clause 8, wherein:
   the first inductor, the second inductor, the third inductor, and the fourth inductor are formed from a first metal layer; and
   the fifth inductor, the sixth inductor, the seventh inductor, and the eighth inductor are formed from a second metal layer above the first metal layer.
10. The apparatus of clause 8 or 9, wherein each of the first inductor, the second inductor, the third inductor, the fourth inductor, the fifth inductor, the sixth inductor, the seventh inductor, and the eighth inductor comprises a respective spiral inductor.
11. The apparatus of any one of clauses 7 to 10, wherein the first inductor and the second inductor are configured to have opposite magnetic polarities, and the third inductor and the fourth inductor are configured to have opposite magnetic polarities.
12. The apparatus of clause 11, wherein the fifth inductor and the sixth inductor are configured to have opposite magnetic polarities, and the seventh inductor and the eighth inductor are configured to opposite magnetic polarities.
13. The apparatus of any one of clauses 1 to 12, further comprising a first capacitor coupled in parallel with a first portion of the inductor structure.
14. The apparatus of clause 13, wherein:
   the first quadrupole inductor comprises a first dipole inductor and a second dipole inductor;
   the second quadrupole inductor comprises a third dipole inductor and a fourth dipole inductor; and
   the first portion of the inductor structure comprises the first dipole inductor and the third dipole inductor.
15. The apparatus of clause 13 or 14, further comprising a second capacitor coupled in parallel with a second portion of the inductor structure.
16. The apparatus of clause 15, wherein:
   the first quadrupole inductor comprises a first dipole inductor and a second dipole inductor;
   the second quadrupole inductor comprises a third dipole inductor and a fourth dipole inductor;
   the first portion of the inductor structure comprises the first dipole inductor and the third dipole inductor; and the second portion of the inductor structure comprises the second dipole inductor and the fourth dipole inductor.

17. The apparatus of clause 16, wherein:
   the first dipole inductor and the second dipole inductor are formed from a first metal layer; and
   the third dipole inductor and the fourth dipole inductor are formed from a second metal layer above the first metal layer.

18. The apparatus of any one of clauses 1 to 12, wherein:
   the first quadrupole inductor comprises a first dipole inductor and a second dipole inductor; and
   the second quadrupole inductor comprises a third dipole inductor and a fourth dipole inductor.

19. The apparatus of clause 18, wherein:
   the inductor structure includes a shunt inductor coupled between a first terminal of the inductor structure and a ground, wherein the shunt inductor includes the first dipole inductor and the third dipole inductor; and
   the inductor structure includes a filter inductor coupled between the first terminal of the inductor structure and a second terminal of the inductor structure, wherein the filter inductor includes the second dipole inductor and the fourth dipole inductor.

20. The apparatus of clause 19, further comprising a capacitor coupled between the second terminal of the inductor structure and the ground.

21. The apparatus of any one of clauses 1 to 12, wherein the inductor structure further comprises:
   a third quadrupole inductor, wherein the third quadrupole inductor overlaps the second quadrupole inductor; and
   a fourth quadrupole inductor, wherein the fourth quadrupole inductor overlaps the third quadrupole inductor.

22. The apparatus of clause 21, wherein:
   the first quadrupole inductor comprises a first dipole inductor and a second dipole inductor;
   the second quadrupole inductor comprises a third dipole inductor and a fourth dipole inductor;
   the third quadrupole inductor comprises a fifth dipole inductor and a sixth dipole inductor; and
   the fourth quadrupole inductor comprises a seventh dipole inductor and an eighth dipole inductor.

23. The apparatus of clause 22, wherein the inductor structure includes a first filter inductor, a second filter inductor, and a third filter inductor, wherein:
   the first filter inductor is coupled between a terminal of the inductor structure and a ground;
   the first filter inductor includes the first dipole inductor, the third dipole inductor, the fifth dipole inductor, and the seventh dipole inductor;
   the second filter inductor includes the second dipole inductor and the fourth dipole inductor;
   the third filter inductor includes the sixth dipole inductor and the eighth dipole inductor; and
   the apparatus further comprises a switch, wherein the second filter inductor, the third filter inductor, and the switch are coupled in series between the terminal of the inductor structure and the ground.

24. The apparatus of clause 22, wherein the inductor structure includes a first filter inductor, a second filter inductor, and a third filter inductor, wherein:
   the first filter inductor is coupled between a terminal of the inductor structure and a ground;

the first filter inductor includes the first dipole inductor, the third dipole inductor, the fifth dipole inductor, and the seventh dipole inductor;
   the second filter inductor includes the second dipole inductor and the fourth dipole inductor;
   the third filter inductor includes the sixth dipole inductor and the eighth dipole inductor; and
   the apparatus further comprises a switch, wherein the second filter inductor, the third filter inductor, and the switch are coupled in a loop.

25. A frequency multiplexer, comprising:
   a first filter coupled between a common port and a first port, wherein the first filter comprises:
   an inductor structure having a first terminal and a second terminal, the inductor structure comprising a conductor path between the first terminal and the second terminal, wherein the conductor path includes:
      a first quadrupole inductor; and
      a second quadrupole inductor, wherein the second quadrupole inductor overlaps the first quadrupole inductor; and
   a second filter coupled between the common port and a second port.

26. The frequency multiplexer of clause 25, wherein the second terminal of the inductor structure is coupled to the first port, and the first filter further comprises a capacitor coupled between the first terminal of the inductor structure and a ground.

27. The frequency multiplexer of clause 25, wherein the first filter further comprises a capacitor coupled in parallel with a portion of the inductor structure.

28. The frequency multiplexer of any one of clauses 25 to 27, further comprising a shunt inductor coupled between the common port and a ground.

29. The frequency multiplexer of any one of clauses 25 to 28, wherein the common port is coupled to an antenna.

30. The frequency multiplexer of any one of clauses 25 to 28, wherein the common port is coupled to a module.

31. The frequency multiplexer of clause 30, wherein the module is an intermediate frequency (IF) module or a radio frequency (RF) module.

32. The frequency multiplexer of any one of clauses 25 to 31, wherein:
   the first quadrupole inductor is formed from a first metal layer; and
   the second quadrupole inductor is formed from a second metal layer above the first metal layer.

33. The frequency multiplexer of any one of clauses 25 to 31, wherein:
   the first quadrupole inductor comprises a first inductor, a second inductor, a third inductor, and a fourth inductor;
   the second quadrupole inductor comprises a fifth inductor, a sixth inductor, a seventh inductor, and an eighth inductor;
   the fifth inductor is coupled between the first inductor and the second inductor; and
   the second inductor is coupled between the fifth inductor and the sixth inductor.

34. The frequency multiplexer of clause 33, wherein:
   the seventh inductor is coupled between the third inductor and the fourth inductor; and
   the fourth inductor is coupled between the seventh inductor and the eighth inductor.

35. The frequency multiplexer of clause 33 or 34, wherein the first inductor, the second inductor, the third inductor, the fourth inductor, the fifth inductor, the sixth inductor, the seventh inductor, and the eighth inductor are coupled such that when a current flows from the first terminal to the second terminal, the current flows in a first direction in the first inductor, the fourth inductor, the fifth inductor, and the eighth inductor, and the current flows in a second direction in the second inductor, the third inductor, the sixth inductor, and the eighth inductor.

36. The frequency multiplexer of clause 35, wherein the first direction is a clockwise direction, and the second direction is a counterclockwise direction.

37. The frequency multiplexer of clause 35, wherein the first direction is a counterclockwise direction, and the second direction is a clockwise direction.

38. An apparatus, comprising:
an inductor structure, wherein the inductor structure includes:
a first dipole inductor; and
a second dipole inductor, wherein the second dipole inductor overlaps the first dipole inductor.

39. The apparatus of clause 38, wherein:
the first dipole inductor is formed from a first metal layer; and
the second dipole inductor is formed from a second metal layer above the first metal layer.

40. The apparatus of clause 38, wherein the inductor structure further comprises:
a third dipole inductor, wherein the third dipole inductor overlaps the second dipole inductor.

41. The apparatus of clause 40, wherein:
the first dipole inductor is formed from a first metal layer;
the second dipole inductor is formed from a second metal layer above the first metal layer; and
the third dipole inductor is formed from a third metal layer above the second metal layer.

42. The apparatus of clause 40, wherein the inductor structure further comprises:
a fourth dipole inductor, wherein the fourth dipole inductor overlaps the third dipole inductor.

43. The apparatus of clause 42, wherein:
the first dipole inductor is formed from a first metal layer;
the second dipole inductor is formed from a second metal layer above the first metal layer;
the third dipole inductor is formed from a third metal layer above the second metal layer; and
the fourth dipole inductor is formed from a fourth metal layer above the third metal layer.

44. The apparatus of any one of clauses 38 to 43, wherein:
the first dipole inductor comprises a first inductor and a second inductor;
the second dipole inductor comprises a third inductor and a fourth inductor; and
the third inductor is coupled between the first inductor and the second inductor.

45. The apparatus of clause 44, wherein:
the first inductor and the second inductor are formed from a first metal layer; and
the third inductor and the fourth inductor are formed from a second metal layer above the first metal layer.

46. The apparatus of clause 44 or 45, wherein each of the first inductor, the second inductor, the third inductor, and the fourth inductor comprises a respective spiral inductor.

47. The apparatus of any one of clauses 44 to 46, wherein the first inductor and the second inductor are configured to have opposite magnetic polarities, and the third inductor and the fourth inductor are configured to have opposite magnetic polarities.

48. A frequency multiplexer, comprising:
a first filter coupled between a common port and a first port, wherein the first filter comprises:
an inductor structure having a first terminal and a second terminal, the inductor structure comprising a conductor path between the first terminal and the second terminal, wherein the conductor path includes:
a first dipole inductor; and
a second dipole inductor, wherein the second dipole inductor overlaps the first dipole inductor; and
a second filter coupled between the common port and a second port.

49. The frequency multiplexer of clause 48, wherein the second terminal of the inductor structure is coupled to the first port, and the first filter further comprises a capacitor coupled between the first terminal of the inductor structure and a ground.

50. The frequency multiplexer of clause 48, wherein the first filter further comprises a capacitor coupled in parallel with the inductor structure.

51. The frequency multiplexer of any one of clauses 48 to 51, further comprising a shunt inductor coupled between the common port and a ground.

52. The frequency multiplexer of any one of clauses 48 to 51, wherein the common port is coupled to an antenna.

53. The frequency multiplexer of any one of clause 48 to 51, wherein the common port is coupled to a module.

54. The frequency multiplexer of clause 53, wherein the module is an intermediate frequency (IF) module or a radio frequency (RF) module.

55. The frequency multiplexer of any one of clauses 48 to 54, wherein:
the first dipole inductor is formed from a first metal layer; and
the second dipole inductor is formed from a second metal layer above the first metal layer.

56. The frequency multiplexer of clause 55, wherein:
the first dipole inductor comprises a first inductor and a second inductor;
the second dipole inductor comprises a third inductor and a fourth inductor; and
the third inductor is coupled between the first inductor and the second inductor.

57. The frequency multiplexer of clause 56, wherein:
the first inductor and the second inductor are formed from a first metal layer; and
the third inductor and the fourth inductor are formed from a second metal layer above the first metal layer.

58. The apparatus of any one of clause 56 or 57, wherein the first inductor, the second inductor, the third inductor, and the fourth inductor are coupled such that when a current flows from the first terminal to the second terminal, the current flows in a first direction in the first inductor and the third inductor, and the current flows in a second direction in the second inductor and the fourth inductor.

59. The apparatus of clause 58, wherein the first direction is a clockwise direction, and the second direction is a counterclockwise direction.

60. The apparatus of clause 58, wherein the first direction is a counterclockwise direction, and the second direction is a clockwise direction.

61. A method of fabricating an inductor structure, comprising:

patterning a first metal layer to form a first quadrupole inductor; and patterning a second metal layer to form a second quadrupole inductor, wherein the second quadrupole inductor overlaps the first quadrupole inductor.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures. It is also to be appreciated that the term "ground" may refer to a DC ground or an AC ground, and thus the term "ground" covers both possibilities. It is to be appreciated than an "input" may be a single-ended input, a differential input, or one of two inputs of a differential input, and an "output" may be a single-ended output, a differential output, or one of two outputs of a differential output.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus, comprising:

an inductor structure, wherein the inductor structure includes:

a first quadrupole inductor; and a second quadrupole inductor, wherein:

the second quadrupole inductor overlaps the first quadrupole inductor, and each of the first quadrupole inductor and the second quadrupole inductor respectively comprises four inductors in which current is configured to flow in a clockwise direction in two of the four inductors and current is configured to flow in a counterclockwise direction in the other two of the four inductors.

2. The apparatus of claim 1, wherein:

the first quadrupole inductor is formed from a first metal layer; and the second quadrupole inductor is formed from a second metal layer above the first metal layer.

3. The apparatus of claim 1, wherein the inductor structure further comprises:

a third quadrupole inductor, wherein the third quadrupole inductor overlaps the second quadrupole inductor.

4. The apparatus of claim 3, wherein:

the first quadrupole inductor is formed from a first metal layer;

the second quadrupole inductor is formed from a second metal layer above the first metal layer; and the third quadrupole inductor is formed from a third metal layer above the second metal layer.

5. The apparatus of claim 3, wherein the inductor structure further comprises:

a fourth quadrupole inductor, wherein the fourth quadrupole inductor overlaps the third quadrupole inductor.

6. The apparatus of claim 5, wherein:

the first quadrupole inductor is formed from a first metal layer;

the second quadrupole inductor is formed from a second metal layer above the first metal layer;

the third quadrupole inductor is formed from a third metal layer above the second metal layer; and the fourth quadrupole inductor is formed from a fourth metal layer above the third metal layer.

7. The apparatus of claim 1, wherein:

the first quadrupole inductor comprises a first inductor, a second inductor, a third inductor, and a fourth inductor;

the second quadrupole inductor comprises a fifth inductor, a sixth inductor, a seventh inductor, and an eighth inductor;

the fifth inductor is coupled between the first inductor and the second inductor; and the second inductor is coupled between the fifth inductor and the sixth inductor.

8. The apparatus of claim 7, wherein:

the seventh inductor is coupled between the third inductor and the fourth inductor; and the fourth inductor is coupled between the seventh inductor and the eighth inductor.

9. The apparatus of claim 8, wherein:

the first inductor, the second inductor, the third inductor, and the fourth inductor are formed from a first metal layer; and the fifth inductor, the sixth inductor, the seventh inductor, and the eighth inductor are formed from a second metal layer above the first metal layer.

10. The apparatus of claim 8, wherein each of the first inductor, the second inductor, the third inductor, the fourth inductor, the fifth inductor, the sixth inductor, the seventh inductor, and the eighth inductor comprises a respective spiral inductor.

11. The apparatus of claim 7, wherein the first inductor and the second inductor are configured to have opposite magnetic polarities, and the third inductor and the fourth inductor are configured to have opposite magnetic polarities.

12. The apparatus of claim 11, wherein the fifth inductor and the sixth inductor are configured to have opposite magnetic polarities, and the seventh inductor and the eighth inductor are configured to opposite magnetic polarities.

13. The apparatus of claim 1, further comprising a first capacitor coupled in parallel with a first portion of the inductor structure.

14. The apparatus of claim 1, wherein:

the first quadrupole inductor comprises a first dipole inductor and a second dipole inductor; and the second quadrupole inductor comprises a third dipole inductor and a fourth dipole inductor.

15. The apparatus of claim 14, wherein:

the inductor structure includes a shunt inductor coupled between a first terminal of the inductor structure and a ground, wherein the shunt inductor includes the first dipole inductor and the third dipole inductor; and the inductor structure includes a filter inductor coupled between the first terminal of the inductor structure and a second terminal of the inductor structure, wherein the filter inductor includes the second dipole inductor and the fourth dipole inductor.

16. The apparatus of claim 1, wherein the inductor structure further comprises:

a third quadrupole inductor, wherein the third quadrupole inductor overlaps the second quadrupole inductor; and a fourth quadrupole inductor, wherein the fourth quadrupole inductor overlaps the third quadrupole inductor.

17. The apparatus of claim 16, wherein:

the first quadrupole inductor comprises a first dipole inductor and a second dipole inductor;

the second quadrupole inductor comprises a third dipole inductor and a fourth dipole inductor;

the third quadrupole inductor comprises a fifth dipole inductor and a sixth dipole inductor; and the fourth quadrupole inductor comprises a seventh dipole inductor and an eighth dipole inductor.

18. The apparatus of claim 17, wherein the inductor structure includes a first filter inductor, a second filter inductor, and a third filter inductor, wherein:

the first filter inductor is coupled between a terminal of the inductor structure and a ground;

the first filter inductor includes the first dipole inductor, the third dipole inductor, the fifth dipole inductor, and the seventh dipole inductor;

the second filter inductor includes the second dipole inductor and the fourth dipole inductor;

the third filter inductor includes the sixth dipole inductor and the eighth dipole inductor; and the apparatus further comprises a switch, wherein the second filter inductor, the third filter inductor, and the switch are coupled in series between the terminal of the inductor structure and the ground.

19. The apparatus of claim 17, wherein the inductor structure includes a first filter inductor, a second filter inductor, and a third filter inductor, wherein:

the first filter inductor is coupled between a terminal of the inductor structure and a ground;

the first filter inductor includes the first dipole inductor, the third dipole inductor, the fifth dipole inductor, and the seventh dipole inductor;

the second filter inductor includes the second dipole inductor and the fourth dipole inductor;

the third filter inductor includes the sixth dipole inductor and the eighth dipole inductor; and the apparatus further comprises a switch, wherein the second filter inductor, the third filter inductor, and the switch are coupled in a loop.

20. A frequency multiplexer, comprising:

a first filter coupled between a common port and a first port, wherein the first filter comprises:

an inductor structure having a first terminal and a second terminal, the inductor structure comprising a conductor path between the first terminal and the second terminal, wherein the conductor path includes:

a first quadrupole inductor; and a second quadrupole inductor, wherein:

the second quadrupole inductor overlaps the first quadrupole inductor, and each of the first quadrupole inductor and the second quadrupole inductor respectively includes four inductors in which current is configured to flow in a clockwise direction in two of the four inductors and current is configured to flow in a counter-clockwise direction in the other two of the four inductors; and a second filter coupled between the common port and a second port.

21. The frequency multiplexer of claim 20, wherein the second terminal of the inductor structure is coupled to the first port, and the first filter further comprises a capacitor coupled between the first terminal of the inductor structure and a ground.

22. The frequency multiplexer of claim 20, wherein the first filter further comprises a capacitor coupled in parallel with a portion of the inductor structure.

23. The frequency multiplexer of claim 20, further comprising a shunt inductor coupled between the common port and a ground.

24. The frequency multiplexer of claim 20, wherein the common port is coupled to an antenna.

25. The frequency multiplexer of claim 20, wherein the common port is coupled to a module.

26. The frequency multiplexer of claim 20, wherein:

the first quadrupole inductor is formed from a first metal layer; and the second quadrupole inductor is formed from a second metal layer above the first metal layer.

27. An apparatus, comprising:

an inductor structure, wherein the inductor structure includes:

a first dipole inductor; and a second dipole inductor, wherein;

the second dipole inductor overlaps the first dipole inductor, and each of the first dipole inductor and the second dipole inductor respectively comprises two inductors configured to have opposite magnetic field polarities due to opposite current flows in the two inductors.

28. The apparatus of claim 27, wherein:

the first dipole inductor is formed from a first metal layer; and the second dipole inductor is formed from a second metal layer above the first metal layer.

29. The apparatus of claim 27, wherein:

the first dipole inductor comprises a first inductor and a second inductor;

the second dipole inductor comprises a third inductor and a fourth inductor; and the third inductor is coupled between the first inductor and the second inductor.

30. The apparatus of claim 29, wherein:

the first inductor and the second inductor are formed from a first metal layer; and the third inductor and the fourth inductor are formed from a second metal layer above the first metal layer.

\* \* \* \* \*